US007282952B2

(12) United States Patent
Oka

(10) Patent No.: US 7,282,952 B2
(45) Date of Patent: Oct. 16, 2007

(54) LEVEL SHIFT CIRCUIT, ELECTRO-OPTICAL DEVICE USING THE SAME, AND ELECTRONIC APPARATUS

(75) Inventor: Hiroko Oka, Suwa (JP)

(73) Assignee: Seiko Epson Corporation (JP)

( * ) Notice: Subject to any disclaimer, the term of this patent is extended or adjusted under 35 U.S.C. 154(b) by 103 days.

(21) Appl. No.: 11/330,365

(22) Filed: Jan. 11, 2006

(65) Prior Publication Data

US 2006/0169909 A1 Aug. 3, 2006

(30) Foreign Application Priority Data

Feb. 1, 2005 (JP) ............................ 2005-024965

(51) Int. Cl.
*H03K 19/0175* (2006.01)

(52) U.S. Cl. ............................ 326/63; 326/68; 326/81

(58) Field of Classification Search .................. 326/63, 326/68, 81; 327/333

See application file for complete search history.

(56) References Cited

U.S. PATENT DOCUMENTS 6,459,312 B2 * 10/2002 Ogawa et al. .............. 327/153
6,522,323 B1 * 2/2003 Sasaki et al. ............... 345/204
6,714,046 B2 * 3/2004 Fujikawa et al. ............. 326/62
6,982,571 B2 * 1/2006 Eldredge et al. .............. 326/63

FOREIGN PATENT DOCUMENTS

JP 2003-110419 4/2003

* cited by examiner

*Primary Examiner*—Vibol Tan
(74) *Attorney, Agent, or Firm*—Harness, Dickey & Pierce, P.L.C.

(57) ABSTRACT

A level shift circuit includes a capacitor element that has one terminal to which a logic input signal having a first logic amplitude is input; a logic output circuit that includes a first logic inverting circuit having a first logic inversion level with respect to an input terminal thereof connected to the other terminal of the capacitor element; and a second logic inverting circuit having a second logic inversion level with respect to an input terminal thereof connected to the other terminal of the capacitor element, and that inverts a logic output signal having a second logic amplitude when output polarities of the first logic inverting circuit and the second logic inverting circuit coincide with each other; and a third logic inverting circuit whose input and output terminals are connected to the other terminal of the capacitor element and that has a third logic inversion level with respect to the input terminal thereof connected to the other terminal of the capacitor element. In the level shift circuit, the first logic inversion level is set to be higher than the third logic inversion level, and the second logic inversion level is set to be lower than the third logic inversion level.

13 Claims, 11 Drawing Sheets

LEVEL SHIFT CIRCUIT, ELECTRO-OPTICAL DEVICE USING THE SAME, AND ELECTRONIC APPARATUS

The entire disclosure of Japanese Application No. 2005-024965, filed Feb. 1, 2005 is expressly incorporated by reference herein.

BACKGROUND

1. Technical Field

The present invention relates to a level shift circuit that converts a logic signal into another logic signal having a different amplitude, to an electro-optical device using the same, and to an electronic apparatus.

2. Related Art

There are known electro-optical devices that display an image by using the electro-optical change of an electro-optical material, such as liquid crystal or electro-luminescent (EL) material. Among them, an active matrix electro-optical device in which pixels are driven by non-linear elements, such as transistors or diodes, can display high-quality images.

The active matrix electro-optical device has the following structure. That is, in the active matrix electro-optical device, pixel electrodes are formed at intersections of scanning lines extending in a row direction and data lines extending in a column direction, and non-linear elements, such as thin film transistors (hereinafter, referred to as TFTs), which are turned on or off in response to scanning signals supplied to the scanning lines are provided between the pixel electrodes and the data lines at the intersections. In addition, the pixel electrodes are arranged opposite to a counter electrode with an electro-optical device interposed therebetween.

However, a relatively high voltage is needed to drive the electro-optical material or the non-linear elements. Meanwhile, since an external control circuit for supplying a clock signal or control signal, which is a driving standard, to the electro-optical device is generally composed of a CMOS circuit, the amplitude of a logic input signal thereof is a voltage of about 3 to 5 V. Further, in general, in the electro-optical device, an amplitude converting circuit (hereinafter, simply referred to as a 'level shift circuit') that converts a low-amplitude logic input signal to a high-amplitude logic output signal is provided at an output portion of a driving circuit for driving the scanning lines and the data lines, or at an input portion for the clock signal.

Further, there is a known level shift circuit that includes first and second capacitors each having one terminal to which a signal is input, an offset circuit which offsets a voltage applied to the other terminal of each of these capacitors, and first and second switching elements which are connected to the other terminals of these capacitors (see JP-A-2003-110419). This level shift circuit can be operated at high speed with a simple structure.

The input sensitivity of the level shift circuit having the above-mentioned structure is determined by threshold voltages of the first and second switching elements. Since the threshold voltages of the switching elements are much affected by variations in a manufacturing process, the input sensitivity of the level shift circuit is also much affected by the variations in a manufacturing process. In addition, since the TFT, serving as a switching element, is formed on an insulator, the threshold voltage thereof is varied by the influence of electric charge stored when on/off operations are repeatedly performed.

SUMMARY

An advantage of some aspects of the invention is that it provides a level shift circuit whose input sensitivity is not much affected by a variation in a manufacturing process, and another advantage of some aspects of the invention is that it provides an electro-optical device using the level shift circuit and an electronic apparatus.

According to an aspect of the invention, a level shift circuit includes a capacitor element that has one terminal to which a logic input signal having a first logic amplitude is input; a logic output circuit that includes a first logic inverting circuit having a first logic inversion level with respect to an input terminal thereof connected to the other terminal of the capacitor element; and a second logic inverting circuit having a second logic inversion level with respect to an input terminal thereof connected to the other terminal of the capacitor element, and that inverts a logic output signal having a second logic amplitude when output polarities of the first logic inverting circuit and the second logic inverting circuit coincide with each other; and a third logic inverting circuit whose input and output terminals are connected to the other terminal of the capacitor element and that has a third logic inversion level with respect to the input terminal thereof connected to the other terminal of the capacitor element. In the level shift circuit, the first logic inversion level is set to be higher than the third logic inversion level, and the second logic inversion level is set to be lower than the third logic inversion level.

Here, the logic inversion level means a logic threshold voltage of an input signal required for the logic inverting circuit to invert the logic level of the output signal. When the voltage of the input signal is lower than the logic inversion level of the logic inverting circuit, each of the logic inverting circuits sets the logic level of the input signal to an L level to invert the output signal into an H level. On the other hand, when the voltage of the input signal is higher than the logic inversion level of the logic-inverting circuit, the logic inverting circuit sets the logic level of the input signal to an H level to invert the output signal into an L level.

In the level shift circuit, the input terminals of the first and second logic inverting circuits are connected to the other terminal of the capacitor element, and input and output terminals of the third logic inverting circuit are also connected to the other terminal of the capacitor element. The logic output circuit inverts the logic output signal when the output polarities of the first and second logic inverting circuits coincide with each other. Here, the first logic inversion level of the first logic inverting circuit is set to be higher than the third logic inversion level, and the second logic inversion level of the second logic inverting circuit is set to be lower than the third logic inversion level. Therefore, when the logic input signal is input to one terminal of the capacitor element and the voltage of the other terminal is higher than the first logic inversion level, the output polarities of the first and second logic inverting circuits coincide with each other, and the logic output signal is inverted. Further, when the voltage of the other terminal is lower than the first logic inversion level, the output polarities of the first and second logic inverting circuits coincide with each other, and the logic output signal is inverted. In this way, the level shift circuit outputs a logic output signal different from the input signal.

According to this structure, the first and second logic inverting circuits connected to the other terminal of the capacitor element have the same structure as the third logic inverting circuit which is also connected to the other terminal of the capacitor element. Therefore, when the third logic inversion level supplied to the other terminal of the capacitor element by the third logic inverting circuit deviates due to a variation in a manufacturing process or a variation in temperature, the first and second logic inversion levels of the first and second logic inverting circuits also deviate due to these factors. Since the input sensitivity of the level shift circuit is determined by a difference between the first and second logic inversion levels and the third logic inversion level, it is possible to reduce the influence of these factors on the input sensitivity of the level shift circuit by offsetting the deviations of these levels.

Further, in the above-mentioned structure, it is preferable that the first logic inverting circuit, the second logic inverting circuit, and the third logic inverting circuit be complementary transistor circuits.

Furthermore, in the above-mentioned structure, it is preferable that the first logic inversion level is set on the basis of the ratio of the dimensions of transistor elements constituting the first logic inverting circuit to the dimensions of transistor elements constituting the third logic inverting circuit, or on the basis of the ratio of the number of serial-parallel stages of the transistor elements constituting the first logic inverting circuit to the number of serial-parallel stages of the transistor elements constituting the second logic inverting circuit, and that the second logic inversion level be set on the basis of the ratio of the dimensions of the transistor elements constituting the second logic inverting circuit to the dimensions of transistor elements constituting the third logic inverting circuit, or on the basis of the ratio of the number of serial-parallel stages of the transistor elements constituting the second logic inverting circuit to the number of serial-parallel stages of the transistor elements constituting the third logic inverting circuit.

According to this structure, it is possible to adjust the logic inversion levels in the circuit layout or design stage by adjusting the dimensions of gates of the transistor elements connected to the other terminal of the capacitor element transistor elements, or by adjusting the number of the transistor elements. In addition, the relationship between the logic inversion levels adjusted in this way is hardly affected by a variation in a manufacturing process.

Furthermore, in the above-mentioned structure, it is preferable that at least one of the first logic inverting circuit, the second logic inverting circuit, and the third logic inverting circuit have another input terminal, and fix an output signal to a predetermined level in response to a signal input to another input terminal, regardless of the signal input to the one input terminal.

According to this structure, when the level shift circuit is not operated, it is possible to prevent a drain current from simultaneously flowing through both the P-channel transistor and the N-channel transistor constituting the complementary transistor circuit, and thus to reduce power consumption.

Further, according to another aspect of the invention, a level shift circuit includes a first capacitor element that has one terminal to which a logic input signal having a first logic amplitude is input; a second capacitor element that has one terminal to which the logic input signal is input; a logic output circuit that includes a first logic inverting circuit having a first logic inversion level with respect to an input terminal thereof connected to the other terminal of the first capacitor element; and a second logic inverting circuit having a second logic inversion level with respect to an input terminal thereof connected to the other terminal of the second capacitor element, and that inverts a logic output signal having a second logic amplitude when output polarities of the first logic inverting circuit and the second logic inverting circuit coincide with each other; a third logic inverting circuit whose input and output terminals are connected to the other terminal of the first capacitor element and that has a third logic inversion level with respect to the input terminal thereof connected to the other terminal of the first capacitor element; and a fourth logic inverting circuit whose input and output terminals are connected to the other terminal of the second capacitor element and that has a fourth logic inversion level with respect to the input terminal thereof connected to the other terminal of the second capacitor element. In the level shift circuit, the first logic inversion level is set to be higher than the third logic inversion level, and the second logic inversion level is set to be lower than the fourth logic inversion level.

According to this structure, a plurality of capacitor elements to which logic input signals are input is provided, and thus it is possible to make the respective capacitor elements correspond to combinations of the logic inversion levels. That is, it is possible to make the first capacitor element correspond to a combination of the first logic inversion level and the third logic inversion level, and to make the second capacitor element correspond to a combination of the second logic inversion level and the fourth logic inversion level. Therefore, it is possible to adjust circuit structures, which are elements of these combinations, or characteristics of the transistor elements constituting the circuits for every capacitor element, and thus to perform the optimum level determination. For example, the first logic inverting circuit and the third logic inverting circuit can have the same circuit structure. In this case, it is possible to offset a variation in a manufacturing process, a variation in temperature, or a change with time occurring in both the first and second logic inverting circuits, and thus to reduce a variation in input sensitivity. In addition, it is possible to independently set input sensitivities to the capacitor elements.

Furthermore, in the above-mentioned structure, it is preferable that the first logic inverting circuit, the second logic inverting circuit, the third logic inverting circuit, and the fourth logic inverting circuit be complementary transistor circuits.

Moreover, in the above-mentioned structure, it is preferable that at least one of the first logic inverting circuit, the second logic inverting circuit, the third logic inverting circuit, and the fourth logic inverting circuit have another input terminal, and fix an output signal to a predetermined level in response to a signal input to another input terminal, regardless of the signal input to the one input terminal.

According to this structure, the first and second logic inverting circuits connected to the other terminal of the capacitor element are composed of complementary transistor circuits, similar to the third and fourth logic inverting circuits which are also connected to the other terminal of the capacitor element. Therefore, when the third and fourth logic inversion levels supplied to the other terminal of the capacitor element by the third and fourth logic inverting circuits deviate due to a variation in a manufacturing process or a variation in temperature, the first and second logic inversion levels of the first and second logic inverting circuits also deviate due to these factors. Thus, it is possible to reduce the influence of these factors on the input sensitivity of the level shift circuit by offsetting the deviations of these levels.

Further, in the above-mentioned structure, it is preferable that the logic output signal having the second logic amplitude be a complementary circuit driving signal for driving the complementary transistor circuits.

Furthermore, in the above-mentioned structure, it is preferable that the level shift circuit further include a complementary transistor circuit that is connected in series to a power source for supplying the second logic amplitude and is driven by the complementary circuit driving signal.

According to this structure, an output buffer composed of a complementary transistor circuit is integrated into the logic output circuit or is provided at the outside of the logic output circuit, which makes it possible to output a large amount of current according to the function of the complementary transistor circuit serving as the output buffer, and to reduce the amount of penetration current occurring when a plurality of transistors constituting the complementary transistor circuit are simultaneously turned on.

Furthermore, according to still another aspect of the invention, an electro-optical device, such as a liquid crystal display device, may include the level shift circuit. Therefore, it is possible to provide an electro-optical device in which a variation in display hardly occurs due to a variation in a manufacturing process.

Moreover, according to yet another aspect of the invention, an electronic apparatus may include the electro-optical device. Therefore, it is possible to provide an electronic apparatus in which a variation in display hardly occurs due to a variation in a manufacturing process.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment

Hereinafter, the structure of a level shift circuit 100 according to a first embodiment of the invention will be described with reference to the accompanying drawings.

1-1. Structure

Figure 1:
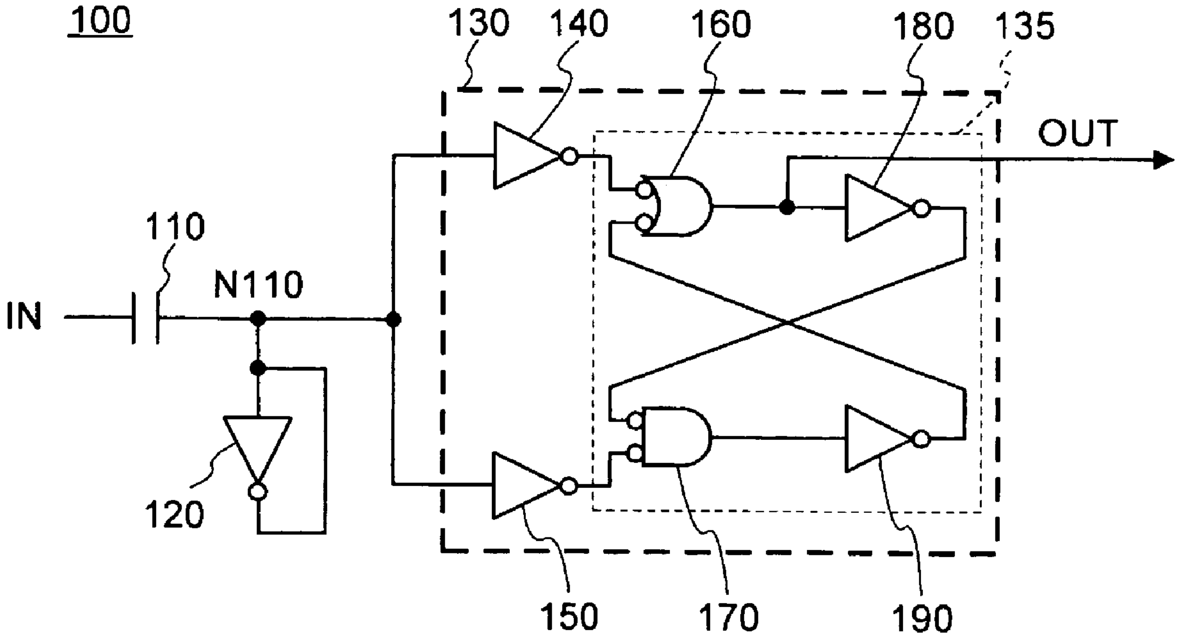
FIG. 1 is a circuit diagram illustrating the structure of a level shift circuit 100 according to a first embodiment of the invention.

FIG. 1 is a circuit diagram illustrating the structure of the level shift circuit 100.

In FIG. 1, a low-amplitude logic input signal, serving as a first logic amplitude before conversion, is input to an input terminal IN, and a high-amplitude logic output signal, serving as a second logic amplitude after the conversion, is output from an output terminal OUT. In the high-amplitude logic output signal, a low (reference) potential corresponding to an L level is referred to as $V_{SS}$, and a high potential corresponding to an H level is referred to as $V_{DD}$. In addition, an inverter circuit is exemplified as a logic inverting circuit, and a P-channel TFT and an N-channel TFT are exemplified as a P-channel transistor and an N-channel transistor, respectively.

In FIG. 1, the level shift circuit 100 includes a capacitor (capacitor element) 110 that passes only alternating current components of the input signal, a logic inverting circuit 120, which is a third logic inverting circuit serving as a bias circuit that supplies a bias voltage $V_B$ to one terminal of the capacitor 110, and a logic output circuit 130.

The logic output circuit 130 includes a logic inverting circuit 140, serving as a first logic inverting circuit, having a first logic inversion level with respect to the input signal, a logic inverting circuit 150, serving as a second logic inverting circuit, having a second logic inversion level with respect to the input signal, and a logic output unit 135.

The logic inverting circuit 140 determines a voltage applied to the one terminal of the capacitor 110, on the basis of a first logic inversion level $V_H$ which is set to be higher than the bias voltage $V_B$, and inverts the logic level of the voltage applied to the one terminal to output it as an output signal.

The logic inverting circuit 150 determines a voltage applied to the one terminal of the capacitor 110, on the basis of a second logic inversion level $V_L$ which is set to be lower than the bias voltage $V_B$, and inverts the logic level of the voltage applied to the one terminal to output it as an output signal.

The logic output unit 135 inverts a logic output signal having the second logic amplitude when output polarities of the logic inverting circuit 140 and the logic inverting circuit 150 coincide with each other. The logic output unit 135 includes a NAND circuit 160, a NOR circuit 170, a logic inverting circuit 180, and a logic inverting circuit 190.

The logic inverting circuit 120 has a third logic inversion level with respect to the input signal, and the third logic inversion level serves as the bias voltage $V_B$.

The individual components of the level shift circuit 100 are formed on the same substrate by the same semiconductor manufacturing process. In addition, TFTs, serving as switching elements, constituting the individual circuits are arranged adjacent to each other.

The input terminal IN of the level shift circuit 100 is connected to one terminal of the capacitor 110, so that logic input signals are input from the input terminal IN to the capacitor 110 through the one terminal. Meanwhile, input and output terminals of the logic inverting circuit 120 are connected to the other terminal of the capacitor 110. In addition, input terminals of the logic inverting circuit 140 and the logic inverting circuit 150 are connected to the other terminal of the capacitor 110. An output terminal of the logic inverting circuit 140 is connected to an input terminal of the NAND circuit 160, and an output terminal of the logic inverting circuit 150 is connected to an input terminal of the NOR circuit 170.

An output terminal of the NAND circuit 160 serves as the output terminal OUT of the level shift circuit 100 and is connected to the logic inverting circuit 180. An output terminal of the logic inverting circuit 180 is connected to an input terminal of the NOR circuit 170. In addition, an output terminal of the NOR circuit 170 is connected to an input terminal of the logic inverting circuit 190, and an output terminal of the logic inverting circuit 190 is connected to the input terminal of the NAND circuit 160.

The logic output unit 135 serves as a storage circuit that stores results determined by the logic inverting circuit 140 and results determined by the logic inverting circuit 150 by using the NAND circuit 160, the NOR circuit 170, the logic inverting circuit 180, and the logic inverting circuit 190. The storage circuit is an RS flip-flop which is reset by an L level signal of the logic inverting circuit 140 and an H level signal of the logic inverting circuit 150.

Next, the structure of the level shift circuit 100 shown in FIG. 1 will be described in more detail, using the levels of the transistors serving as switching elements.

Figure 2:
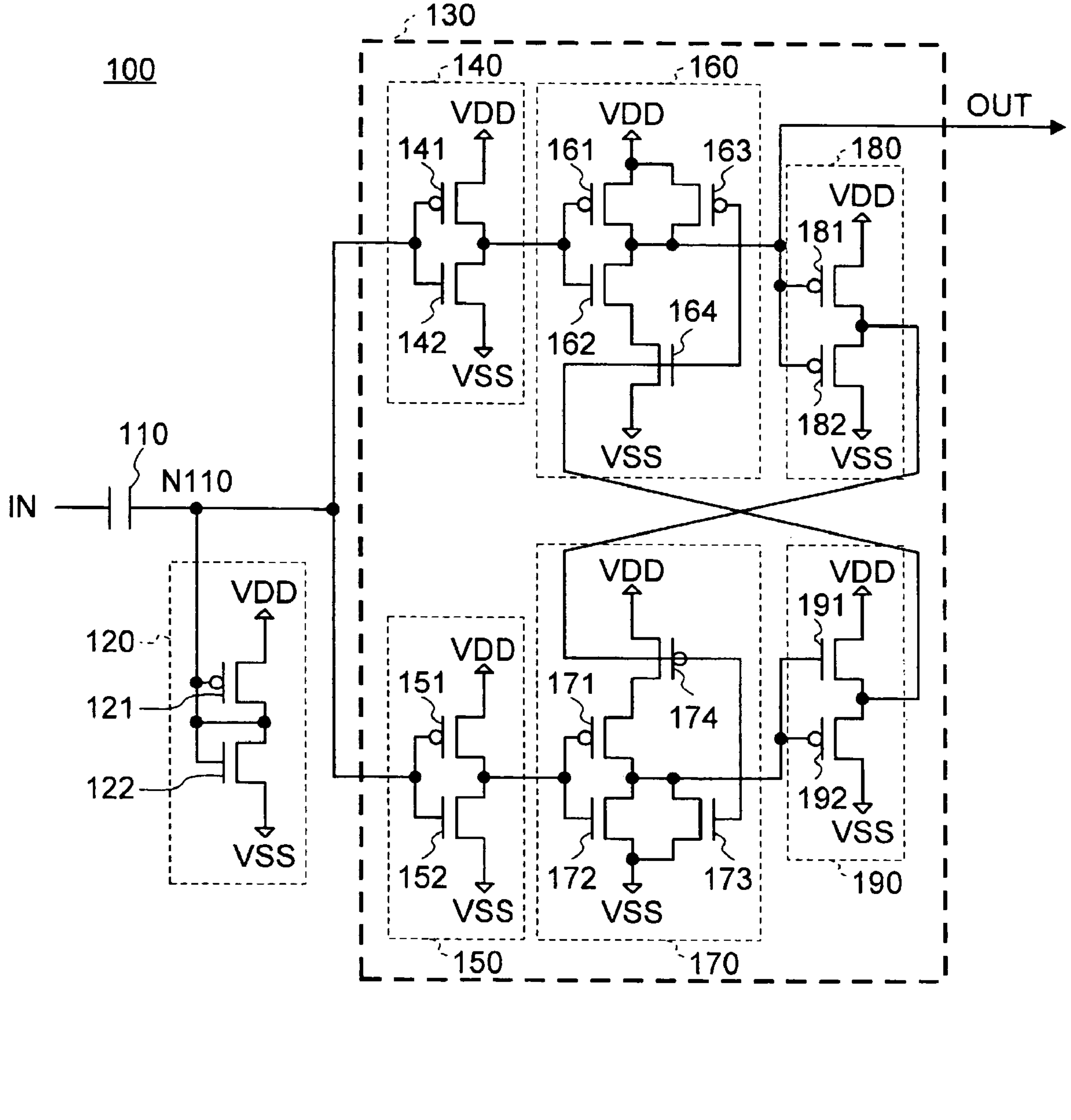
FIG. 2 is a circuit diagram illustrating the structure of the level shift circuit 100 from the viewpoint of transistor levels.

FIG. 2 is a circuit diagram illustrating the structure of the level shift circuit 100 by using the levels of the transistors.

In FIG. 2, the logic inverting circuits 140, 150, and 120 are complementary transistor circuits each composed of a P-channel TFT and an N-channel TFT.

In the logic inverting circuit 120, sources of a P-channel TFT 121 and an N-channel TFT 122 are respectively connected to $V_{DD}$ and $V_{SS}$. A drain and a gate of each of the TFTs are connected to a common node N110 as the output and input terminals of the logic inverting circuit 120, and the node N110 is connected to the other terminal of the capacitor 110. In this way, the node N110 is biased to the bias voltage $V_B$, which is the third logic inversion level, by the logic inverting circuit 120.

Further, the node N110 is connected to gates of a P-channel TFT 141 and an N-channel TFT 142 which constitute the logic inverting circuit 140. Sources of the P-channel TFT 141 and the N-channel TFT 142 are respectively connected to $V_{DD}$ and $V_{SS}$. Drains thereof are commonly connected to the output terminal of the logic inverting circuit 140.

Furthermore, the node N110 is connected to gates of a P-channel TFT 151 and an N-channel TFT 152 which constitute the logic inverting circuit 150. Sources of the P-channel TFT 151 and the N-channel TFT 152 are respectively connected to $V_{DD}$ and $V_{SS}$. Drains thereof are commonly connected to the output terminal of the logic inverting circuit 150.

The bias voltage $V_B$ supplied from the logic inverting circuit 120 to the node N110 is determined by the characteristics of the P-channel TFT 121 and the N-channel TFT 122 constituting the logic inverting circuit 120, which will be described later.

Further, the first logic inversion level $V_H$, which is a standard to cause the logic inverting circuit 140 to determine the voltage of the logic input signal as an H level or an L level, is determined on the basis of the characteristics of the P-channel TFT 141 and the N-channel TFT 142. Similarly, the second logic inversion level $V_L$, which is a standard to cause the logic inverting circuit 150 to determine the logic of the input signal, is determined on the basis of the characteristics of the P-channel TFT 151 and the N-channel TFT 152.

In the level shift circuit 100, the ratio of the gate length and the gate width of each of the TFTs constituting the logic inverting circuits 120, 140, and 150 is adjusted such that the first logic inversion level $V_H$ of the logic inverting circuit 140 is set to be higher than the bias voltage $V_B$ and the second logic inversion level $V_L$ Of the logic inverting circuit 150 is set to be lower than the bias voltage $V_B$. The setting of the voltage will be described below.

First, the bias voltage $V_B$ of the logic inverting circuit 120 will be described.

Since the input terminal and the output terminal of the logic inverting circuit 120 are connected to each other, an input voltage $V_i$ and an output voltage $V_o$ of the logic inverting circuit 120 are equal to each other. Therefore, a logic inversion level, which is a standard for determining the logic level of the input voltage $V_i$, turns to the output voltage $V_o$ and thus turns to the bias voltage $V_B$ supplied from the logic inverting circuit 120. In this way, it is possible to easily obtain the bias voltage $V_B$ around the logic inversion level of a logic inverting circuit by commonly connecting the input and output terminals of the logic inverting circuit 120 to feed back the output voltage to the input terminal of the bias circuit.

Next, a drain current $I_{dp}$ flowing through the P-channel TFT 121 of the logic inverting circuit 120 and a drain current $I_{dn}$ flowing through the N-channel TFT 122 thereof are calculated.

When a threshold voltage of the P-channel TFT 121 is $V_{tp}$ and a threshold voltage of the N-channel TFT 122 is $V_{tn}$, the drain currents $I_{dp}$ and $I_{dn}$ are calculated by the following approximate expressions.

$$I_{dp}=K_p(V_{DD}-V_O-V_{tp})^2$$

$$I_{dn}=K_n(V_O-V_{tn})^2 \quad \text{[Expression 1]}$$

$$K_p=(\mu_p C_{op}/2)\cdot(W_p/L_p)$$

$$K_n=(\mu_n C_{on}/2)\cdot(W_n/L_n) \quad \text{[Expression 2]}$$

In the above expression, $W_p$ and $L_p$ indicate the gate width and the gate length of the P-channel TFT 121, respectively, and $W_n$ and $L_n$ indicate the gate width and the gate length of the N-channel TFT 122, respectively. In addition, $W_p/L_p$ and $W_n/L_n$ respectively indicate the ratio of the gate width to the gate length of the P-channel TFT 121 and the ratio of the gate width to the gate length of the N-channel TFT 122, that is, the ratios of the dimensions of each gate. In addition, $\mu_p$ and $\mu_n$ indicate carrier mobilities of the P-channel TFT and the N-channel TFT, respectively, and $C_{op}$ and $C_{on}$ indicate coefficients of parasitic capacitances.

The drain current $I_{dp}$ of the P-channel TFT 121 flows through the drain of the N-channel TFT 122. Therefore, the following expression is obtained.

$$I_{dp}=I_{dn} \quad \text{[Expression 3]}$$

Here, a coefficient α satisfying the following expression is introduced.

$$\frac{K_n}{K_p}=\alpha^2 \quad \text{[Expression 4]}$$

Then, the output level $V_o$ of the logic inverting circuit 120 is determined as the bias voltage $V_B$ by the following expression.

$$V_B=\frac{(V_{DD}-V_{tp}-\alpha V_{tn})}{(1+\alpha)} \quad \text{[Expression 5]}$$

In this case, when α=1 and $V_{tp}=V_{tn}$, the output voltage $V_o$ is $V_{DD}/2$.

Further, the first logic inversion levels $V_H$ and the second logic inversion levels $V_L$ of the logic inverting circuits 140 and 150 can be calculated in the same manner as that used for the logic inverting circuit 120. More specifically, when the input and output terminals of each of the logic inverting circuits 140 and 150 are connected to each other, it is possible to calculate the logic inversion level $V_H$ or the logic inversion level $V_L$ as the output voltage.

Here, the ratio of the gate width $W_p$ to the gate length $L_p$ of the TFT constituting the logic inverting circuits 140 is different from the ratio of the gate width $W_p$ to the gate length $L_p$ of the TFT constituting the logic inverting circuits 150, and the ratio of the gate width $W_n$ to the gate length $L_n$ of the TFT constituting the logic inverting circuits 140 is different from the ratio of the gate width $W_n$ to the gate length $L_n$ of the TFT constituting the logic inverting circuits 150. In addition, these ratios are different from those of the logic inverting circuit 120. Therefore, coefficients α' and α", which are different from the coefficient α, are set in the logic inverting circuits 140 and 150, respectively.

The first logic inversion level $V_H$ of the logic inverting circuit 140 and the second logic inversion level $V_L$ of the logic inverting circuit 150 are calculated by the following expression.

$$V_H=\frac{(V_{DD}-V_{tp}-\alpha' V_{tn})}{(1+\alpha')} \quad \text{[Expression 6]}$$

$$V_L=\frac{(V_{DD}-V_{tp}-\alpha'' V_{tn})}{(1+\alpha'')}$$

As such, the first logic inversion level $V_H$ of the logic inverting circuit 140 and the second logic inversion level $V_L$ of the logic inverting circuit 150 are different from each other, and are different from the bias voltage $V_B$ of the logic inverting circuit 120.

More specifically, the first logic inversion level $V_H$, the second logic inversion level $V_L$, and the bias voltage $V_B$ are set so as to satisfy the following relationship.

$$V_L<V_B<V_H \quad \text{[Expression 7]}$$

That is, the first logic inversion level $V_H$ of the logic inverting circuit 140 is set to be higher than the bias voltage $V_B$ of the logic inverting circuit 120, and the second logic inversion level $V_L$ of the logic inverting circuit 150 is set to be lower than the bias voltage $V_B$ Of the logic inverting circuit 120. For example, the sizes of the P-channel TFTs 141, 121, and 151 of the logic inverting circuits 140, 120, and 150 are set such that the P-channel TFT 141 has the largest gate length, followed by the P-channel TFT 121, and the P-channel TFT 151, but the other dimensions thereof are equal to each other, which causes the coefficients to satisfy the following expression.

$$\alpha''>\alpha>\alpha' \quad \text{[Expression 8]}$$

As such, the first logic inversion level $V_H$ is set on the basis of the ratio of the dimensions of the transistor element constituting the logic inverting circuit 140 to the dimensions of the transistor element constituting the logic inverting circuit 120. The second logic inversion level $V_L$ is set on the basis of the ratio of the dimensions of the transistor element constituting the logic inverting circuit 150 to the dimensions of the transistor element constituting the logic inverting circuit 120.

Figure 3:
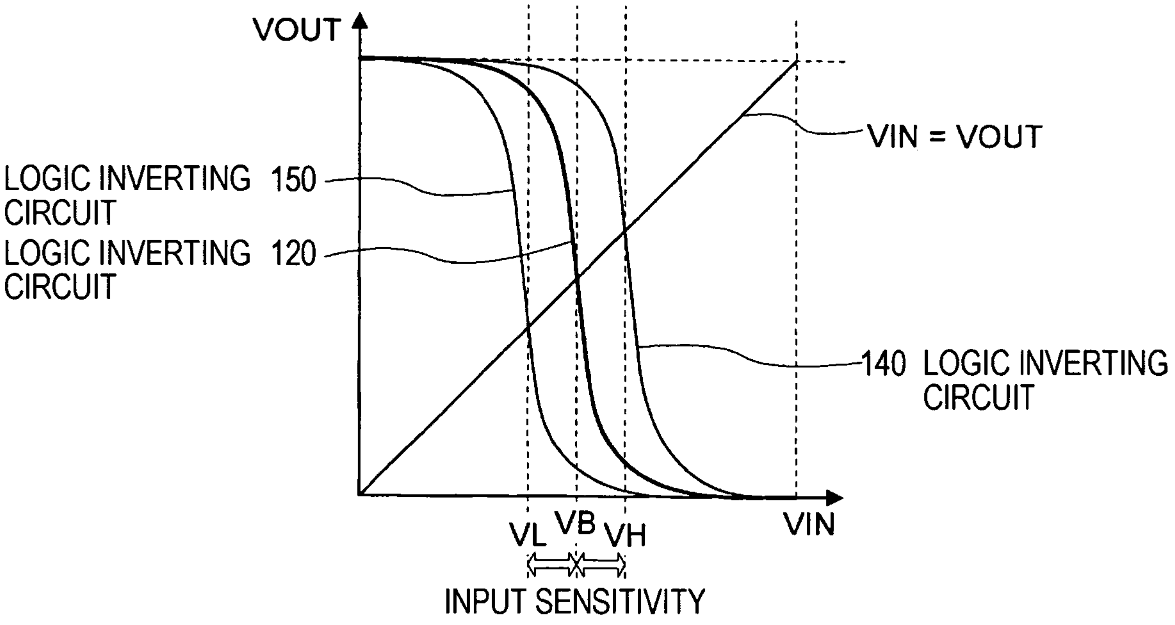
FIG. 3 is a graph illustrating input/output characteristics of logic inverting circuits 120, 140, and 150.

FIG. 3 is a graph illustrating input/output characteristics of the logic inverting circuits 120, 140, and 150.

Since the input terminal and the output terminal of the logic inverting circuit 120 are connected to each other, the bias voltage $V_B$ is represented by an intersection of a straight line where VIN=VOUT and an input/output characteristic curve of the logic inverting circuit 120 in FIG. 3.

When the logic inverting circuit 140 is separately extracted and the input terminal and the output terminal thereof are connected to each other, the first logic inversion level $V_H$ is represented by an intersection of the straight line where VIN=VOUT and an input/output characteristic curve of the logic inverting circuit 140 in FIG. 3.

Similarly, for the logic inverting circuit 150, the second logic inversion level $V_L$ is represented by an intersection of the straight line where VIN=VOUT and an input/output characteristic curve of the logic inverting circuit 150 in FIG. 3.

The relationship $V_L<V_B<V_H$ is shown in the graph of FIG. 3.

1-2. Operation

Next, the operation of the level shift circuit 100 will be described below.

Figure 4:
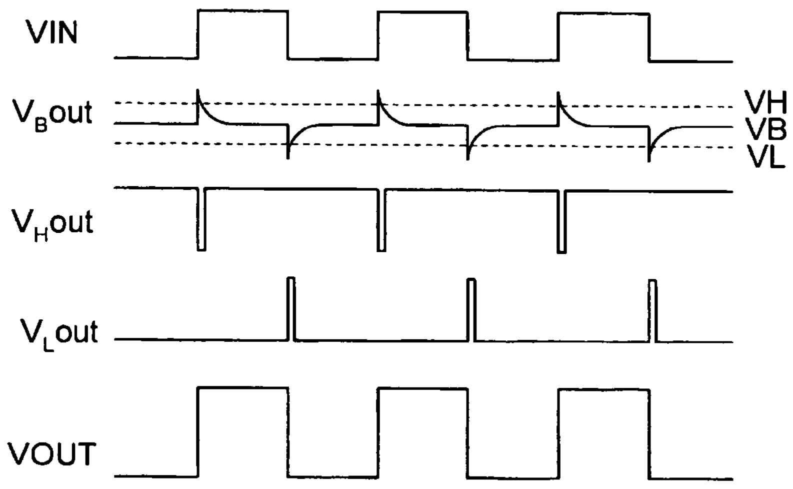
FIG. 4 is a timing chart illustrating voltage waveforms of units provided in the level shift circuit 100.

FIG. 4 is a diagram illustrating the operation of the level shift circuit 100, and shows voltage waveforms of the individual units of the level shift circuit 100.

First, when a low-amplitude logic input signal VIN is input to the input terminal IN, a voltage waveform $V_B$out obtained by adding (offsetting) the bias voltage $V_B$ to a differential waveform of the logic input signal VIN is represented at the node N110, that is, the other terminal of the capacitor 110.

When the voltage of the node N110 is higher than the first logic inversion level $V_H$, the logic inverting circuit 140 determines that the input signal has an H level, and thus sets an output signal $V_H$out to be an L level. Here, since the logic inverting circuit 150 maintains the output signal $V_L$out at the L level, the output polarities of the logic inverting circuit 140 and the logic inverting circuit 150 coincide with each other. In this case, an H level signal is output from the output terminal of the NAND circuit 160 connected to the output terminal OUT, and an L level signal is output from the output terminal of the logic inverting circuit 180. As a result, an H level signal is output from the output terminal of the NOR circuit 170, and an L level signal is output from the output terminal of the logic inverting circuit 190. Then, the input of the NAND circuit 160 turns to an L level, and thus this state is maintained. As such, when the output polarities of the logic inverting circuits 140 and 150 coincide with each other, the logic output unit 135 including the NAND circuit 160, the NOR circuit 170, the logic inverting circuit 180, and the logic inverting circuit 190 inverts the logic output signal output from the output terminal OUT. The logic output unit 135 maintains the result determined by the logic inverting circuit 140 that the voltage of the node N110 is higher than the first logic inversion level $V_H$ even after the voltage of the node N110 becomes lower than the first logic inversion level $V_H$.

Meanwhile, when the voltage of the node N110 becomes lower than the second logic inversion level $V_L$, the logic inverting circuit 150 sets the input signal to be an L level, and the output signal $V_L$out to be an H level. Since the logic inverting circuit 140 sets the output signal $V_H$out to the H level, the output polarities of the logic inverting circuits 140 and 150 coincide with each other. In addition, an L level signal is output from the output terminal of the NOR circuit 170, and an H level signal is output from the output terminal of the logic inverting circuit 190 connected to the input terminal of the NAND circuit 160. In this case, since an H level signal is input to another input terminal of the NAND circuit 160, an L level signal is output from the output terminal of the NAND circuit 160 connected to the output terminal OUT. As a result, an H level signal is output from the output terminal of the logic inverting circuit 180, and thus this state is maintained. As such, when the output polarities of the logic inverting circuits 140 and 150 coincide with each other, the logic output unit 135 inverts the logic output signal output from the output terminal OUT again. The logic output unit 135 maintains the result determined by the logic inverting circuit 150 that the voltage of the node N110 is lower than the second logic inversion level $V_L$ even after the voltage of the node N110 becomes higher than the second logic inversion level $V_L$.

When the low-amplitude logic input signal VIN supplied to the input terminal IN of the level shift circuit 100 turns to an H level, the high-amplitude logic output signal VOUT output from the output terminal OUT turns to an H level. In contrast, when the logic input signal VIN turns to an L level, the high-amplitude logic output signal VOUT output from the output terminal OUT turns to an L level. Therefore, the high-amplitude logic output signal corresponding to the low-amplitude logic input signal supplied to the input terminal IN of the level shift circuit 100 is output from the output terminal OUT. In addition, the state in which the logic output signal VOUT is at an H level is maintained until the logic input signal VIN turns to the L level, and the state in which the logic output signal VOUT is at an L level is maintained until the logic input signal VIN turns to the H level.

When the output polarities of the logic inverting circuits 140 and 150 coincide with each other, the logic output unit 135 inverts the logic output signal output from the output terminal OUT. Therefore, the voltage of the other terminal of the capacitor 110 returns to about the bias voltage $V_B$ with time, which causes the output of the logic output signal not to be varied even when the voltage is lower than the first logic inversion level $V_H$, or is larger than the second logic inversion level $V_L$. Thus, it is possible to make the output of the logic output signal follow an input signal having a long variation period.

1-3. Effects

In the level shift circuit 100, a difference between the first logic inversion level $V_H$ and the bias voltage $V_B$ and a difference between the second logic inversion level $V_L$ and the bias voltage $V_B$ correspond to input sensitivities. That is, when the first logic inversion level $V_H$ is set to be higher than the bias voltage $V_B$, the second logic inversion level $V_L$ is set to be lower than the bias voltage $V_B$, and the difference between the first logic inversion level $V_H$ and the bias voltage $V_B$ is balanced with the difference between the second logic inversion level $V_L$ and the bias voltage $V_B$, the variation of the logic input signal supplied to the input terminal IN is determined as a normal state by the logic inverting circuit 140 and the logic inverting circuit 150.

However, in the related art, when an integrated level shift circuit is formed on a substrate, switching elements, such as a P-channel TFT and an N-channel TFT, are connected to a terminal of a capacitor element, and the voltage of a logic input signal is determined on the basis of a threshold voltage of the TFTs. However, this structure makes it difficult to form the TFTs and a bias circuit such that the balance among characteristics of the P-channel and N-channel TFTs and characteristics of the bias circuit is ideally kept, due to, for example, a variation in manufacture. In addition, the TFTs are formed on a glass substrate, unlike a MOS (metal oxide semiconductor) transistor formed on a silicon substrate. Since the glass substrate is an insulator, the threshold voltage of the TFT formed on the glass substrate is changed during operation by electric charges stored when a gate is turned ON or OFF, which results in a change of input sensitivity.

In contrast, according to this embodiment, it is possible to reduce a relative variation between the bias voltage $V_B$ and the first and second logic inversion levels $V_H$ and $V_L$. Hereinafter, this operation will be described.

Sensitivity with respect to the rise of an input signal of the level shift circuit 100, that is, input sensitivity at high potential thereof, satisfies the following expression.

$$V_H - V_B = (V_{DD} - V_{tp} - \alpha' V_{tn})(1+\alpha') - (V_{DD} - V_{tp} - \alpha V_{tn})(1+\alpha) \quad \text{[Expression 9]}$$

As represented in the above expression, the input sensitivity depends on a difference between coefficients α' and α. Here, the coefficient α of the logic inverting circuit 120 is set as represented in the following expression.

$$\alpha^2 = \frac{Kn}{Kp} = \frac{(\mu_n C_o/2)\cdot(W_n/L_n)}{(\mu_p C_o/2)\cdot(W_p/L_p)} \quad \text{[Expression 10]}$$

In the above expression, $W_p/L_p$ and $W_n/L_n$ respectively indicate the ratio of the gate width to the gate length of the P-channel TFT and the ratio of the gate width to the gate length of the N-channel TFT.

Meanwhile, the coefficient α' is set in the logic inverting circuit 140.

In the level shift circuit 100, the input sensitivity is adjusted by making the coefficients α and α' have different values, as represented in the following expression.

$$\frac{\alpha'}{\alpha} = 1 + \delta \quad \text{[Expression 11]}$$

In the above expression, the value of α'/α depends on the dimensions of the TFTs provided in the logic inverting circuit 120 and the logic inverting circuit 140. Therefore, it is possible to adjust the input sensitivity of the level shift circuit 100 by changing the ratio of the dimensions of the TFT.

Further, the P-channel TFT 121 provided in the logic inverting circuit 120 and the P-channel TFT 141 provided in the logic inverting circuit 140 are formed on the same substrate. Therefore, among characteristics of the two TFTs, the threshold voltages $V_{tp}$ and $V_{tn}$ are markedly changed due to a variation in a substrate manufacturing process. However, a difference in the threshold voltage $V_{tp}$ between the TFTs respectively provided in the logic inverting circuits 120 and 140 that are arranged on the same substrate so as to be adjacent to each other and a difference in the threshold voltage $V_{tn}$ therebetween is very small. Therefore, when $\delta<<1$, the dependence of $V_H-V_B$ on the threshold voltages $V_{tp}$ and $V_{tn}$ is very small.

Therefore, a difference between the coefficients $\alpha$ and $\alpha'$ depends on the dimensions of the gates of the TFTs, and the threshold voltages thereof are not much affected by the variation in a manufacturing process. As a result, the input sensitivity of the level shift circuit 100 depending on the difference between the coefficients $\alpha$ and $\alpha'$ is also not much affected by a variation in a manufacturing process.

Further, a coefficient $\alpha''$ is set in the logic inverting circuit 150 in the same manner as that used in the logic inverting circuit 140. Therefore, an input sensitivity $V_B-V_L$ of the input signal at a low potential side also depends on the ratio of the gate width to the gate length of the TFT, and the logic inverting circuit 150 is not much affected by a variation in a manufacturing process.

As such, the logic inverting circuits 140 and 150 for determining a voltage are composed of complementary transistors, similar to the logic inverting circuit 120 for supplying a bias voltage, and the logic inverting circuits 140, 150, and 120 are formed on the same substrate by the same manufacturing process. Therefore, the deviation of the bias voltage of the logic inverting circuit 120, which is a complementary transistor circuit, caused by a variation in a manufacturing process is offset by the deviation of the logic inversion levels of the logic inverting circuits 140 and 150, which are complementary transistor circuits. This structure makes it possible to reduce the influence of a variation in a manufacturing process on the input sensitivity of the level shift circuit 100, and thus to stabilize the input sensitivity.

Further, the logic inverting circuits 120, 140, and 150 are composed of complementary TFTs formed on an insulator. Therefore, the amounts of electric charges stored in the respective TFTs during the ON/OFF operations thereof are offset, similar to the above-mentioned case. The deviation of the bias voltage caused by a variation in the threshold voltage of the TFT included in the logic inverting circuit 120 is offset by the deviation of the logic inversion level caused by a variation in the threshold voltages of the TFTs included in the logic inverting circuits 140 and 150, which makes it possible to reduce a change in the input sensitivity of the level shift circuit 100.

In the level shift circuit 100, since the logic inverting circuits 120, 140, and 150 function as logic inverting circuits, it is easy to offset a change in voltage caused by a variation in a manufacturing process. Thus, it is possible to reduce the influence of the variation in a manufacturing process on the input sensitivity.

2. Second Embodiment

2-1. Structure

Figure 5:
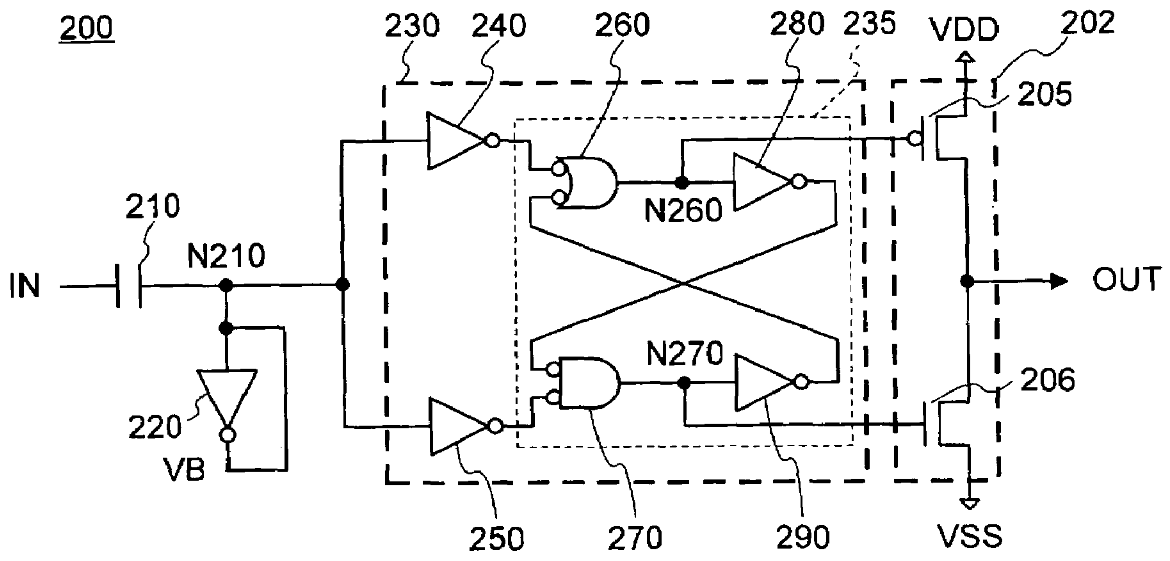
FIG. 5 is a circuit diagram illustrating the structure of a level shift circuit 200 according to a second embodiment of the invention.

FIG. 5 is a circuit diagram illustrating the structure of a level shift circuit 200 according to a second embodiment of the invention.

The structure of the level shift circuit 200 of this embodiment is different from that of the level shift circuit 100 of the first embodiment in that an output buffer 202 is provided. The output butter 202 is a complementary transistor circuit in which a P-channel TFT 205 and an N-channel TFT 206 are connected in series between power sources $V_{SS}$ and $V_{DD}$ supplied to the high-amplitude logic output signals.

Here, a logic output unit 235 of the level shift circuit 200 outputs, as logic output signals, two types of complementary transistor circuit driving signals for driving the complementary transistor circuit to the output buffer 202. One type of complementary circuit driving signal is used for performing current control on the P-channel TFT 205 constituting the complementary transistor circuit of the output buffer 202, and the other type of complementary circuit driving signal is used for performing current control on the N-channel TFT 206. More specifically, when an L-level voltage is supplied to a gate of the P-channel TFT 205 constituting the output buffer 202 as the complementary circuit driving signal, the P-channel TFT 205 turns to an ON state. Then, when an H-level voltage is supplied thereto, the P-channel TFT 205 turns to an OFF state. On the other hand, when an H-level voltage is supplied to a gate of the N-channel TFT 206 as the complementary circuit driving signal, the N-channel TFT 206 turns to an ON state. Then, when an L-level voltage is supplied thereto, the N-channel TFT 206 turns to an OFF state.

When both the P-channel TFT 205 and the N-channel TFT 206 turn to ON states, the complementary circuit driving signal is delayed by a predetermined time, and is then output. When both the transistors turns to OFF states, the complementary circuit driving signal is immediately inverted.

More specifically, when it is determined that the level of an input signal of a logic inverting circuit 240 is higher than the first logic inversion level $V_H$, one type of complementary circuit driving signal supplied from a NAND circuit 260 to the P-channel TFT 205 turns to an H level to make the P-channel TFT 205 in an OFF state. In addition, the one type of complementary circuit driving signal passes through a logic inverting circuit 280 and a NOR circuit 270 to be delayed as the other type of complementary circuit driving signal having an H level which makes the N-channel TFT 206 in an ON state. That is, the logic inverting circuit 280 and the NOR circuit 270 function as a delay element.

On the other hand, when it is determined that the level of an input signal of a logic inverting circuit 250, serving as a second logic inverting circuit, is lower than the second logic inversion level $V_L$, the other type of complementary circuit driving signal supplied from the NOR circuit 270 to the N-channel TFT 206 turns to an L level to make the N-channel TFT 206 in an OFF state. In addition, the other type of complementary circuit driving signal passes through a logic inverting circuit 290 and a NOR circuit 260 to be delayed as the one type of complementary circuit driving signal having an L level which makes the P-channel TFT 205 in an ON state. That is, the logic inverting circuit 290 and the NOR circuit 260 function as a delay element.

Further, the logic inverting circuits 280 and 290 are constituted by connecting a plurality of inverter circuits, and the number of connection states increases, which makes it possible to adjust the delay amount of the complementary circuit driving signal.

Since the level shift circuit 200 provided with the output buffer 202, a signal obtained by inverting the logic of the signal input to the input terminal-IN is output from the output terminal OUT of the level shift circuit 200. The other structure of this embodiment is similar to that of the first embodiment, and thus a description thereof will be omitted.

2-2. Operation

Next, the operation of the level shift circuit 200 will be described below.

When the voltage of a node N210 is higher than the first logic inversion level $V_H$, an H level signal, which is one type of complementary circuit driving signal, is output from the NAND circuit 260. In this case, the output signal of the NOR circuit 270, which is the other type of complementary driving signal, is more delayed than the output signal of the NAND circuit 260 in time to turn to an H level. After the P-channel TFT 205 turns to an OFF state, the N-channel TFT 206 turns to an ON state.

On the other hand, when the voltage of the node N210 becomes lower than the second logic inversion level $V_L$, an L level signal, which is the other type of complementary circuit driving signal, is output from the NOR circuit 270. In this case, the output signal of the NAND circuit 260, which is one type of complementary driving signal, is more delayed than the output signal of the NOR circuit 270 in time to turn to an L level. After the N-channel TFT 206 turns to an OFF state, the P-channel TFT 205 turns to an ON state.

That is, in both cases, one of the transistors constituting the output buffer 202 turns to an OFF state, and thus the other transistor turns to an ON state.

2-3. Effects

As such, when the P-channel TFT 205 and the N-channel TFT 206 constituting the output buffer turn to ON states, the complementary circuit driving signal output from the logic inverting circuit 230 is delayed to be output. On the other hand, when the TFTs turn to OFF states, the complementary circuit driving signal is immediately inverted. Therefore, one of the P-channel TFT 205 and the N-channel TFT 206 turns to an OFF state, and then the other TFT turns to an ON state. Therefore, it is possible to output a large amount of current corresponding to the function of the output buffer, and to reduce a pass current generated when the two transistors turn to the ON states.

3. Third Embodiment

In the above-mentioned embodiment, in order to make the logic inversion level of the logic inverting circuit different from the bias voltage output from the bias circuit, the gates of the N-channel TFT and the P-channel TFT are formed to have different dimensions. However, in a third embodiment, it is possible to make the logic inversion level of the logic inverting circuit different from the bias voltage even when the dimensions of the N-channel TFT and the P-channel TFT are equal to each other.

3-1. Structure

Figure 6:
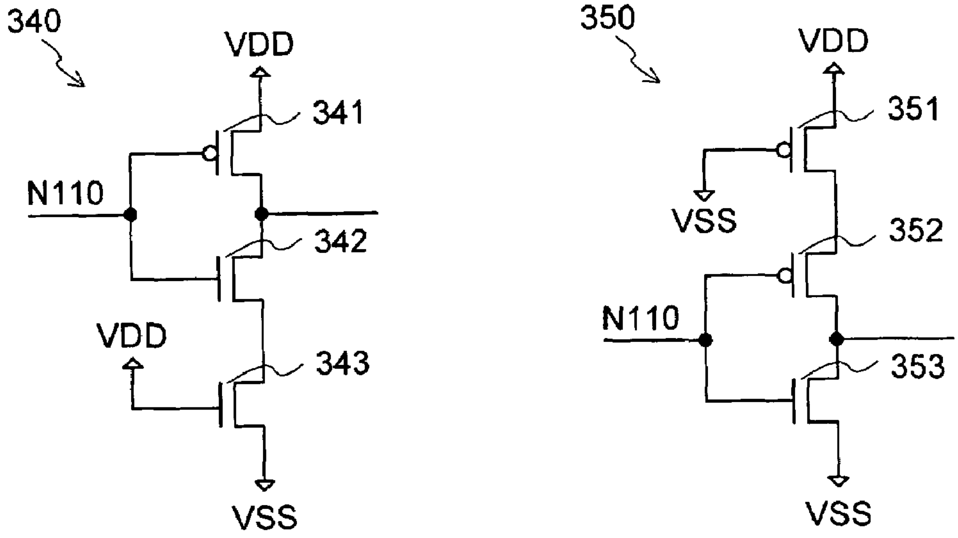
FIG. 6 is a circuit diagram illustrating the structure of an inverter according to a third embodiment of the invention, from the viewpoint of transistor levels.

FIG. 6 is a circuit diagram illustrating the structure of a logic inverting circuit 340, serving as a first logic inverting circuit, and a logic inverting circuit 350 serving as a second logic inverting circuit, according to the third embodiment of the invention, from the viewpoint of transistor levels.

A level shift circuit of this embodiment is different from the level shift circuit 200 of the second embodiment in that a logic inverting circuit 340 includes a P-channel TFT 341 and two N-channel TFTs 342 and 343 and in that a logic inverting circuit 350 includes two P-channel TFTs 351 and 352 and an N-channel TFT 353.

The other structure of this embodiment is similar to that of the second embodiment, and thus a description thereof will be omitted.

In FIG. 6, specifically, in the logic inverting circuit 340 serving as a first determining circuit, a source of the P-channel TFT 341 is connected to $V_{DD}$, and a drain thereof is connected to a source of the N-channel TFT 342. In addition, a drain of the N-channel TFT 342 is connected to a drain of the N-channel TFT 343, and a source of the N-channel TFT 343 is connected to $V_{SS}$. Both gates of the P-channel TFT 341 and the N-channel TFT 342 are connected to the node N110, and a gate of the N-channel TFT 343 is connected to $V_{DD}$.

Meanwhile, in the logic inverting circuit 350 serving as a second determining circuit, a source of the P-channel TFT 351 is connected to $V_{DD}$, and a drain thereof is connected to a source of the P-channel TFT 352. In addition, a drain of the P-channel TFT 352 is connected to a drain of the N-channel TFT 353, and a source of the N-channel TFT 353 is connected to $V_{SS}$. Both gates of the P-channel TFT 352 and the N-channel TFT 353 are connected to the node N110, and a gate of the P-channel TFT 351 is connected to $V_{SS}$.

Further, in this embodiment, gates of the P-channel TFTs provided in the logic inverting circuits 120, 340, and 350 are similar to each other, and gates of the N-channel TFTs provided therein are also similar to each other. In this way, standard TFTs having the same dimensions can be used as the TFTs of the logic inverting circuits 120, 340, and 350. In addition, the P-channel TFTs may be formed such that gates thereof have substantially the same dimensions, and the N-channel TFTs may be formed such that gates thereof have substantially the same dimensions.

3-2. Operation

Next, the relationship between a bias voltage and a logic inversion level in the third embodiment will be described.

The bias voltage $V_B$ supplied from the logic inverting circuit 120 and the first and second logic inversion levels $V_H$ and $V_L$ of the logic inverting circuits 340 and 350 are calculated by the following expression.

$$V_B = \frac{(V_{DD} - V_{tp} - \alpha V_{tn})}{(1+\alpha)} \quad \text{[Expression 12]}$$

$$V_H = \frac{(V_{DD} - V_{tp} - \alpha' V_{tn})}{(1+\alpha')}$$

$$V_L = \frac{(V_{DD} - V_{tp} - \alpha'' V_{tn})}{(1+\alpha'')}$$

In the above expression, a coefficient α is determined by the dimensions of the gates of the N-channel TFT and the P-channel TFT constituting a circuit.

$$\alpha = \sqrt{\frac{(\mu_n C_O/2)\cdot(W_n/L_n)}{(\mu_p C_O/2)\cdot(W_p/L_p)}} \quad \text{[Expression 13]}$$

Coefficients α' and α" are determined by the same standard as described above.

In FIG. 6, the N-channel TFT 343 of the logic inverting circuit 340 is always in an ON state since a gate thereof is connected to $V_{DD}$. This is equivalent to a structure in which gates of the N-channel TFT 343 and the N-channel TFT 342 are connected to the common node N110 by the operation of the logic inverting circuit 340. In this case, it is considered that two N-channel TFTs 342 and 343 are equivalent to one N-channel TFT whose gate width is substantially equal to the gate length of the N-channel TFTs 342 and 343 and whose gate length is substantially two times that of the N-channel TFT. Therefore, the relationship $\alpha'<\alpha$ is established, and the relationship $V_H>V_B$ is established, that is, the first logic inversion level $V_H$ is set to be higher than the bias voltage $V_B$.

Therefore, it is possible to set the first logic inversion level $V_H$ to be higher than the bias voltage $V_B$ by increasing the number of N-channel TFTs in which a source and a drain are connected to each other in series. That is, the first logic inversion level is set on the basis of the ratio of the number of serial-parallel stages of the transistor element constituting the logic inverting circuit 340 to the number of serial-parallel stages of the transistor element constituting the logic inverting circuit 120.

Meanwhile, in the logic inverting circuit 350, it is considered that two P-channel TFTs 351 and 352 are equivalent to one N-channel TFT whose gate width is substantially equal to the gate length of the P-channel TFTs 351 and 352 and whose gate length is substantially two times that of the P-channel TFT. Therefore, the relationship $\alpha''>\alpha$ is established, and the relationship $V_L<V_B$ is established, that is, the second logic inversion level $V_L$ is set to be lower than the bias voltage $V_B$.

Therefore, it is possible to set the second logic inversion level $V_L$ to be lower than the bias voltage $V_B$ by increasing the number of P-channel TFTs in which a source and a drain are connected to each other in series. That is, the second logic inversion level is set on the basis of the ratio of the number of serial-parallel stages of the transistor element constituting the logic inverting circuit 350 to the number of serial-parallel stages of the transistor element constituting the logic inverting circuit 120.

3-3. Effects

In this way, it is possible to adjust a difference between the first logic inversion level $V_H$ and the second logic inversion level $V_L$ by making the number of N-channel TFTs or P-channel TFTs included in the logic inverting circuit 340 different from the number of the same type of TFTs included in the logic inverting circuit 350 and by changing the number of serial-parallel stages of both types of TFTs.

For example, it is possible to set the first logic inversion level $V_H$ to be higher than the bias voltage $V_B$ and the second logic inversion level $V_L$ to be lower than the bias voltage $V_B$ by adjusting the number of TFTs in which a source and a drain are connected to each other among the logic inverting circuits 120, 340, and 250, without making the gate dimensions of the TFTs different from each other.

Therefore, it is possible to easily adjust the number of TFTs in a circuit design stage, not in a mask layout design stage.

Furthermore, in the logic inverting circuits 340 and 350, the gates of the N-channel TFT 343 and the P-channel TFT 351 are connected to a power source, not to the node N 110, in order to suppress an increase in the parasitic capacitance of the gate connected to the node N 110. This structure prevents an increase in the parasitic capacitance of the gate connected to the node N110 which causes the voltage drop of input signals of the logic inverting circuits 340 and 350. Therefore, it is possible to prevent a reduction in input sensitivity.

4. Fourth Embodiment

4-1. Structure

Figure 7:
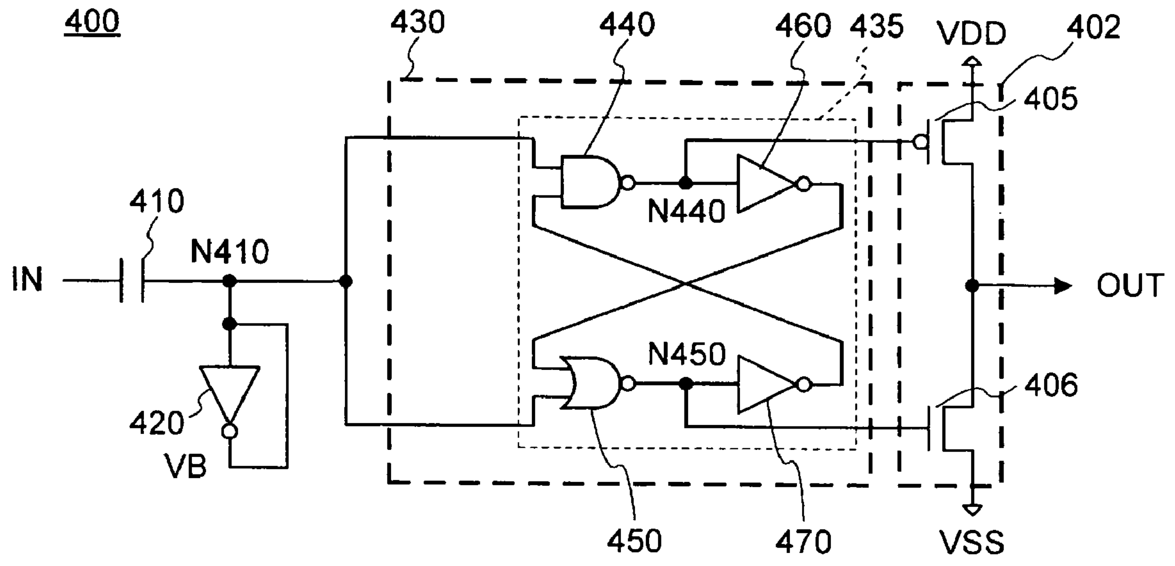
FIG. 7 is a circuit diagram illustrating the structure of a level shift circuit 400 according to a fourth embodiment of the invention.

FIG. 7 is a circuit diagram illustrating the structure of a level shift circuit 400 according to a fourth embodiment of the invention.

The level shift circuit 400 of this embodiment is different from the level shift circuit 200 (see FIG. 5) of the second embodiment in that a NAND circuit 440 and a NOR circuit 450 are respectively used as the first and second logic inverting circuits and the NAND circuit 440 and the NOR circuit 450 are integrally formed with an RS flip-flop serving as a logic inverting circuit. Here, the NAND circuit 440 can have a general structure in which two P-channel TFTs are connected to each other in parallel and two N-channel TFTs are connected to each other in series. In addition, the NOR circuit 450 can have a general structure in which two P-channel TFTs are connected to each other in series and two N-channel TFTs are connected to each other in parallel. Further, in this embodiment, the number of logic inverting circuits of the level shift circuit 400 is smaller than that of the level shift circuit 200 in the second embodiment by one. Therefore, a non-inversion signal of the signal input to the input terminal IN is output from the output terminal OUT. The other structures are similar to those in the second embodiment, and thus a description thereof will be omitted.

4-2. Operation

The operation of the level shift circuit 400 will be described below.

When a low-amplitude logic input signal is supplied from an input terminal IN to one terminal of a capacitor 410 and a voltage applied to a node N410, which is the other terminal of the capacitor 410, is higher than a first logic inversion level $V_H$ of a NAND circuit 440 serving as a first logic inverting circuit, an L-level signal is output from the NAND circuit 440, and thus an L-level signal is output from a NOR circuit 450 supplied with an H-level signal output from a logic inverting circuit 460. As a result, an H-level signal is output from a logic inverting circuit 470, and the output of the NAND circuit 440 is maintained. Therefore, a P-channel TFT 405 connected to the output of the NAND circuit 440 turns to an ON state, and an N-channel TFT 406 connected to the output of the NOR circuit 450 turns to an OFF state. Thus, an H level signal is output from an output terminal OUT.

On the other hand, when the voltage applied to the node N410 is lower than a second logic inversion level $V_L$, an H-level signal is output from the NOR circuit 450, and thus an H-level signal is output from the NAND circuit 440. Therefore, the P-channel TFT 405 turns to an ON state, and the N-channel TFT 406 turns to an OFF state. Thus, an L-level signal is output from the output terminal OUT.

As a result, a non-inversion logic signal of the signal input to the input terminal IN of the level shift circuit 400 is output from the output terminal OUT.

4-3. Effects

In this way, it is possible to incorporate the NAND circuit 440, serving as the first logic inverting circuit, and the NOR circuit 450, serving as the second logic inverting circuit, into a holding circuit included in a logic output circuit 430. Therefore, it is possible to realize a level shift circuit with a small number of gates.

In the NAND circuit 440 of the level shift circuit 400, two P-channel TFTs are connected to each other in parallel, and two N-channel TFTs are connected to each other in series. In addition, in the NOR circuit 450, two P-channel TFTs are connected to each other in series, and two N-channel TFTs are connected to each other in parallel. Therefore, even when the P-channel TFTs having the same gate dimensions and the N-channel TFTs having the same gate dimensions are used, the first logic inversion level $V_H$ of the NAND circuit 440 is set to be higher than the bias voltage $V_B$, and the second logic inversion level $V_L$ of the NOR circuit 450 is set to be lower than the bias voltage $V_B$. The use of the NAND circuit 440 and the NOR circuit 450 makes it possible to set the logic inversion levels for proper determination, without changing the ratio of the dimensions of the respective TFTs.

5. Fifth Embodiment

5-1. Structure

Figure 8:
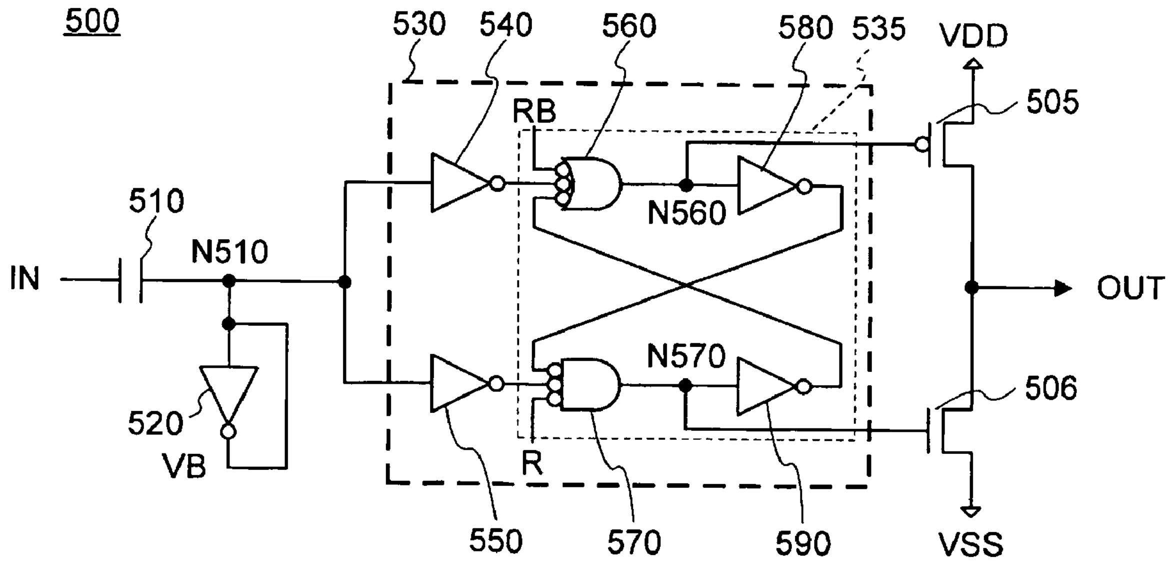
FIG. 8 is a circuit diagram illustrating the structure of a level shift circuit 500 according to a fifth embodiment of the invention.

FIG. 8 is a circuit diagram illustrating the structure of a level shift circuit 500 according to a fifth embodiment of the invention.

The level shift circuit 500 of this embodiment is different from the level shift circuit 200 (see FIG. 5) of the second embodiment in that a three-input NAND circuit 560 and a three-input NOR circuit 570 are used as a NAND circuit and a NOR circuit constituting a logic output unit 535. Here, a reset signal R for initializing the level shift circuit 500 is input to one of three input terminals of the NOR circuit 570, and an inversion signal RB of the reset signal R is input to one of three input terminals of the NAND circuit 560.

The other structures are the same as those in the second embodiment, and thus a description thereof will be omitted.

5-2. Operation

Next, the operation of the level shift circuit 500 will be described.

First, when an H-level signal is supplied as the reset signal R and an L-level signal is supplied as the inversion signal RB of the reset signal, an H-level signal is output from the NAND circuit 560, and thus an L-level signal is output from a logic inverting circuit 580. Therefore, the L-level signal is input to the NOR circuit 570. Meanwhile, an L-level signal is output from the NOR circuit 570, and an H-level signal is output from a logic inverting circuit 590. Therefore, the H-level signal is input to the NAND circuit 560. Thus, the inner state of the level shift circuit 500 is initialized, and this initialized state is maintained even after the reset signal R turns to an L-level and the inversion signal RB turns to an H-level.

Subsequently, when a low-amplitude logic input signal is supplied from an input terminal IN to one terminal of a capacitor 510 and a voltage applied to a node N510, which is the other terminal of the capacitor 510, is lower than a second logic inversion level $V_L$, an L-level signal is output from the NOR circuit 570, and thus an L-level signal is output from the NAND circuit 560. As a result, an N-channel TFT 506 turns to an OFF state, and a P-channel TFT 505 turns to an ON state. Thus, an H-level signal is output from an output terminal OUT.

On the other hand, when the voltage applied to the node N510 is higher than a first logic inversion level $V_H$, an H-level signal is output from the NAND circuit 560, and an H-level signal is output from the NOR circuit 570. Therefore, the N-channel TFT 506 turns to an ON state, and the P-channel TFT 505 turns to an OFF state. Thus, an L-level signal is output from the output terminal OUT.

As a result, an inversion signal of the signal input to the input terminal IN of the level shift circuit 500 is output from the output terminal OUT.

5-3. Effects

Since the level shift circuit 500 has a reset signal input for initializing the inner state thereof, it is possible to confirm the state of the output signal and the inner state before the low-amplitude logic input signal is input. In particular, when a number of level shift circuits 500 are used, it is possible to uniform the initial states thereof after power is turned on.

6. Sixth Embodiment

6-1. Structure

Figure 9:
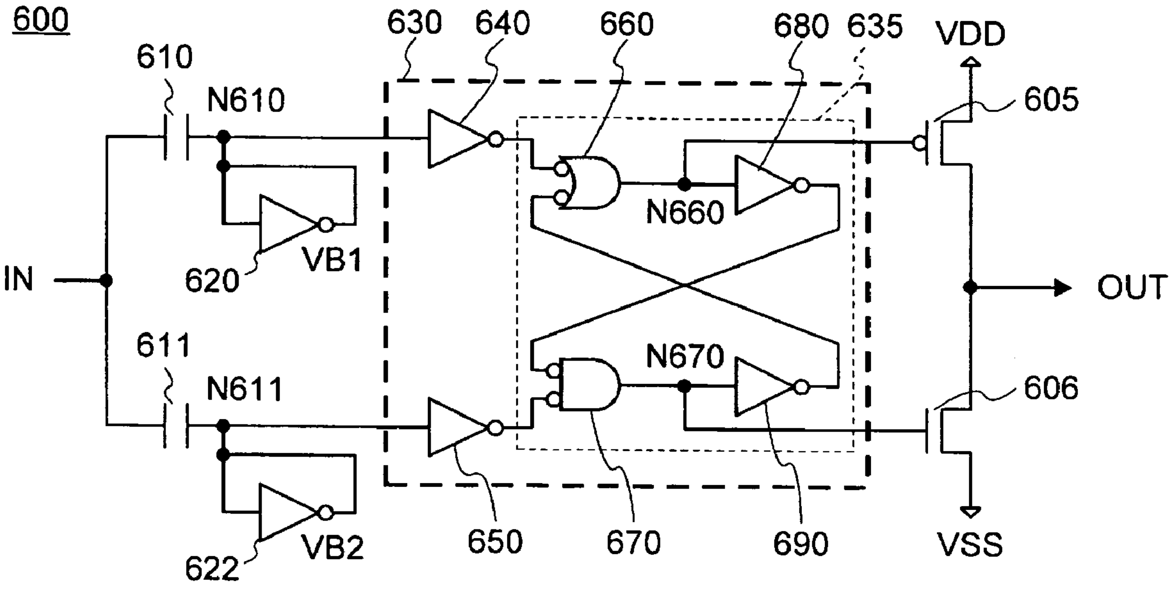
FIG. 9 is a circuit diagram illustrating the structure of a level shift circuit 600 according to a sixth embodiment of the invention.

FIG. 9 is a circuit diagram illustrating the structure of a level shift circuit 600 according to a sixth embodiment of the invention.

The level shift circuit 600 of this embodiment is different from the level shift circuit 200 (see FIG. 5) of the second embodiment in that two capacitor elements to which low-amplitude input signals are input are provided.

More specifically, the level shift circuit 600 includes a capacitor 610, serving as a first capacitor element, a capacitor 611, serving as a second capacitor element (wherein a common logic input signal is input to one terminal of each of the level shift circuits 610 and 611), a logic inverting circuit 620, serving as a third logic inverting circuit and a first bias circuit for supplying a first bias voltage $V_{B1}$ to the other terminal of the capacitor 610, a logic inverting circuit 622, serving as a fourth logic inverting circuit and a second bias circuit for supplying a second bias voltage $V_{B2}$ different from the first bias voltage $V_{B1}$ to the other terminal of the capacitor 611, a logic inverting circuit 640, serving as a first logic inverting circuit having a first logic inversion level $V_H$, and a logic inverting circuit 650, serving as a second logic inverting circuit having a second logic inversion level $V_L$. The logic inverting circuits 620, 640, 622, and 650 are complementary transistor circuits.

The other structures are the same as those in the second embodiment, and thus a description thereof will be omitted.

In the level shift circuit 600, the first logic inversion level $V_H$ of the logic inverting circuit 640 is set to be higher than the first bias voltage $V_{B1}$ supplied from the logic inverting circuit 620, and the second logic inversion level $V_L$ of the logic inverting circuit 650 is set to be lower than the second bias voltage $V_{B2}$ which has a fourth logic inversion level and is supplied from the logic inverting circuit 622. This setting can be performed by adjusting the ratio of the dimensions of a transistor element constituting the logic inverting circuit 640 to the dimensions of a transistor element constituting the logic inverting circuit 620, or the ratio of the number of serial-parallel stages of the transistor element constituting the logic inverting circuit 640 to the number of serial-parallel stages of the transistor element constituting the logic inverting circuit 620, and by adjusting the ratio of the dimensions of a transistor element constituting the logic inverting circuit 650 to the dimensions of a transistor element constituting the logic inverting circuit 622, or the ratio of the number of serial-parallel stages of the transistor element constituting the logic inverting circuit 650 to the number of serial-parallel stages of the transistor element constituting the logic inverting circuit 622. This adjustment is performed in such a way that the logic inverting circuit 640 has the largest gate length of a P-channel TFT, followed by the logic inverting circuit 620, the logic inverting circuit 622, and the logic inverting circuit 650, and the other dimensions of the logic inverting circuits 640, 620, 622, and 650 are set to be equal to each other.

Figure 10:
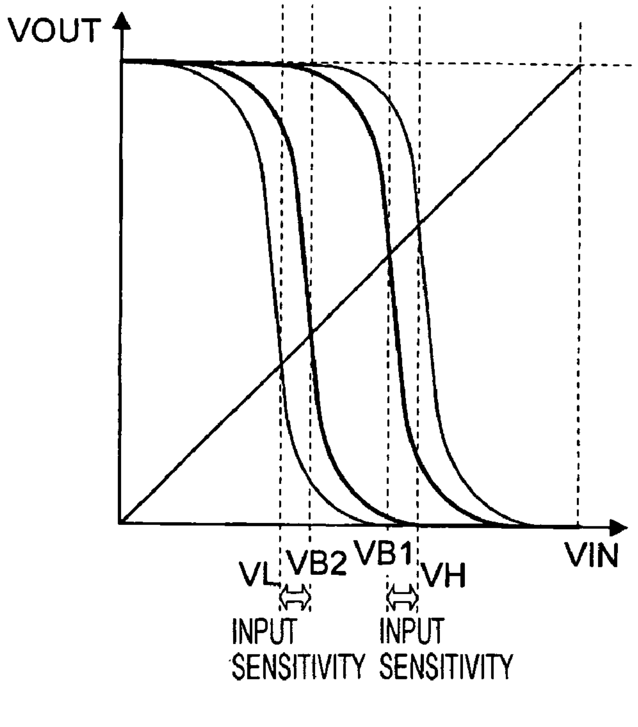
FIG. 10 is a graph illustrating input/output characteristics of logic inverting circuits 620, 640, and 622.

FIG. 10 is a graph illustrating input/output characteristics of the logic inverting circuits 620, 640, 622 and 650.

Since an output terminal of each of the logic inverting circuits 620 and 622 is connected to an input terminal thereof, the bias voltages $V_{B1}$ and $V_{B2}$ are represented by intersections of input/output characteristic curves of the logic inverting circuits 620 and 622 and a straight line where VIN=VOUT. When input and output terminals of each of the logic inverting circuits 640 and 650 are connected to each other, the first and second logic inversion levels $V_H$ and $V_L$ are represented by intersections of the input/output characteristic curves and the straight line where VIN=VOUT, similar to the logic inverting circuit 120. In this graph, the relationships $V_L<V_{B1}$ and $V_{B2}<V_H$ are shown.

6-2. Operation

Next, the operation of the level shift circuit 600 will be described.

Figure 11:
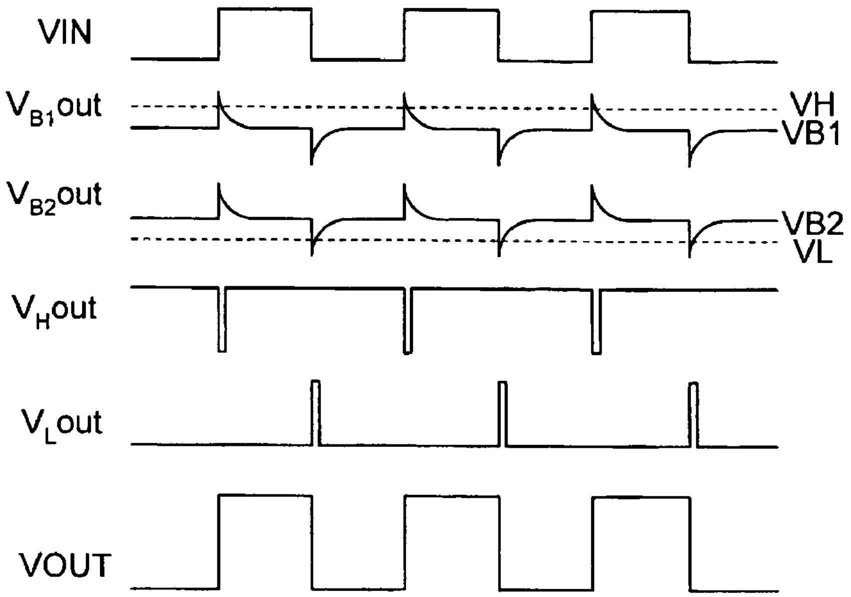
FIG. 11 is a timing chart illustrating voltage waveforms of units provided in the level shift circuit 600.

FIG. 11 is a diagram illustrating the operation of the level shift circuit 600 and shows voltage waveforms of each unit of the level shift circuit 600.

When a low-amplitude logic input signal is supplied from an input terminal IN to one terminal of the capacitor 610 and a voltage applied to a node N610, which is the other terminal of the capacitor 610, is higher than the first logic inversion level $V_H$, an L-level signal is output from the logic inverting circuit 640. Then, an H-level signal is output from a NAND circuit 660, and an H-level signal is output from a NOR circuit 670. Therefore, a P-channel TFT 605 turns to an OFF state, and an N-channel TFT 606 turns to an ON state. Thus, an L-level signal is output from an output terminal OUT.

On the other hand, when a voltage applied to a node N611 is lower than the second logic inversion level $V_L$, an H-level signal is output from the logic inverting circuit 650. Then, an L-level signal is output from the NOR circuit 670, and an L-level signal is output from the NAND circuit 660. Therefore, the N-channel TFT 606 turns to an OFF state, and the P-channel TFT 605 turns to an ON state. Thus, an H-level signal is output from the output terminal OUT.

As a result, an inversion signal of the signal input to the input terminal IN of the level shift circuit 600 is output from the output terminal OUT.

6-3. Effects

The level shift circuit 600 includes a plurality of capacitors 610 and 611 to which a common logic input signal is input, and the capacitors 610 and 611 are respectively associated with combinations of separate bias voltages and logic inversion levels. That is, it is possible to associate the capacitor 610 with a combination of the bias voltage $V_{B1}$ and the first logic inversion level $V_H$, and the capacitor. 611 with a combination of the bias voltage $V_{B2}$ and the second logic inversion level $V_L$. Therefore, it is possible to independently adjust characteristics of elements constituting the logic inverting circuits 620 and 622 and the logic inverting circuits 640 and 650 for each of the capacitors 610 and 611, and thus to set the optimum logic inversion level. For example, it is possible to raise the input sensitivity by independently adjusting the bias voltages $V_{B1}$ and $V_{B2}$ to be respectively set around the first and second logic inversion levels $V_H$ and $V_L$.

For example, when the logic inverting circuit 640 has a different circuit structure from the logic inverting circuit 650, the logic inverting circuit 620 is formed to have the same circuit structure as that of the logic inverting circuit 640. In this case, a variation in a manufacturing process occurring in both circuits, and a change with time can be removed, which makes it possible to reduce a variation in input sensitivity. In addition, it is possible to independently adjust the input sensitivity for each of the capacitors 610 and 611.

7. Seventh Embodiment 7-1. Structure

Figure 12:
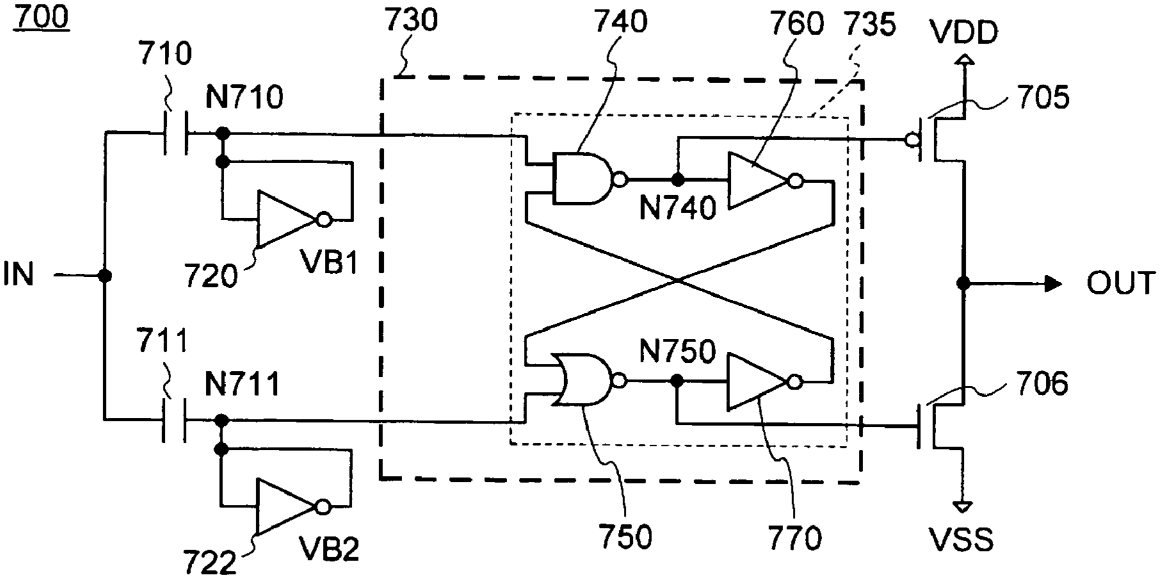
FIG. 12 is a circuit diagram illustrating the structure of a level shift circuit 700 according to a seventh embodiment of the invention.

FIG. 12 is a circuit diagram illustrating the structure of a level shift circuit 700 according to a seventh embodiment of the invention.

The level shift circuit 700 of this embodiment is different from the level shift circuit 600 (see FIG. 9) of the sixth embodiment in that a NAND circuit 740 and a NOR circuit 750 are used as a first logic inverting circuit and a second logic inverting circuit, respectively, and an RS flip-flop, serving as a logic output unit including the NAND circuit 740, the NOR circuit 750, and logic inverting circuits 760 and 770, is integrally formed with the first and second logic inverting circuits. The other structures are the same as those in the sixth embodiment, and thus a description thereof will be omitted.

7-2. Operation and Effects

This embodiment has both the characteristics of the sixth embodiment and the characteristics of the fourth embodiment. That is, the NAND circuit 740, serving as the first logic inverting circuit, and the NOR circuit 750, serving as the second logic inverting circuit, also function as the RS flip-flop serving as a logic output circuit. Therefore, it is possible to realize a level shift circuit with a small number of gates, and to perform the optimum level determination by independently adjusting characteristics of elements constituting the logic inverting circuits 720 and 722, the NAND circuit 740, and the NOR circuit 750 for each of capacitors 710 and 711.

8. Eighth Embodiment 8-1. Structure

Figure 13:
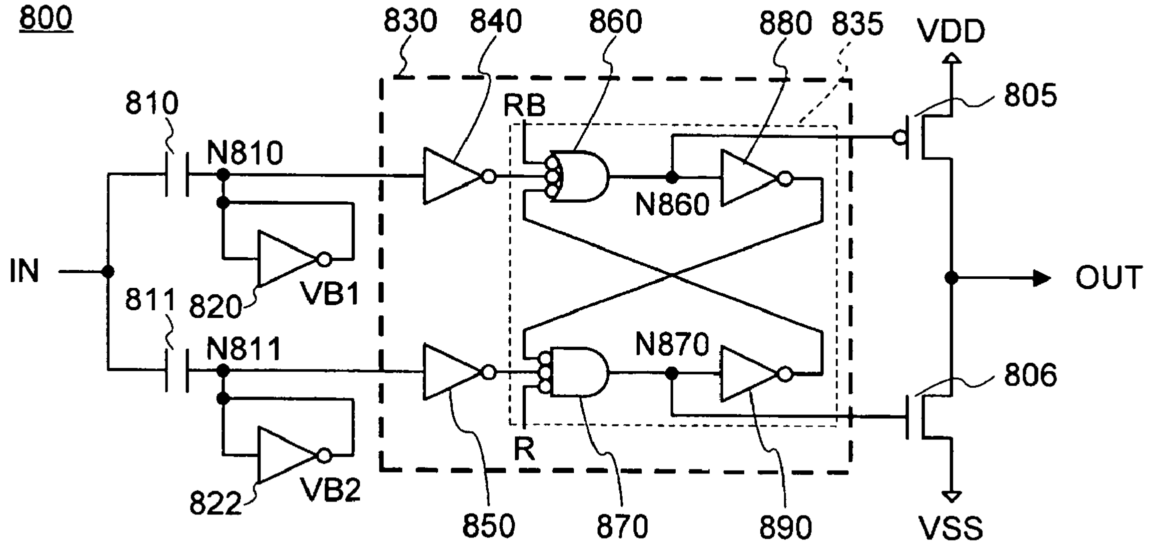
FIG. 13 is a circuit diagram illustrating the structure of a level shift circuit 800 according to an eighth embodiment of the invention.

FIG. 13 is a circuit diagram illustrating the structure of a level shift circuit 800 according to an eighth embodiment of the invention.

The level shift circuit 800 of this embodiment is different from the level shift circuit 600 (see FIG. 9) of the sixth embodiment in that a three-input NAND circuit 860 and a three-input. NOR circuit 870 are respectively used as a NAND circuit and a NOR circuit constituting an RS flip-flop. A reset signal R for initializing the level shift circuit 800 is input to one of three input terminals of the NOR circuit 870, and an inversion signal RB of the reset signal R is input to one of three input terminals of the NAND circuit 860. The other structures are the same as those in the sixth embodiment, and thus a description thereof will be omitted.

8-2. Operation and Effects

This embodiment has both the characteristics of the sixth embodiment and the characteristics of the fifth embodiment.

That is, since the level shift circuit 800 has a reset signal input for initializing the inner state thereof, it is possible to confirm the state of the output signal and the inner state before a low-amplitude logic input signal is input. In particular, when a number of level shift circuits 800 are used, it is possible to uniform the initial states thereof after power is turned on.

9. Ninth Embodiment 9-1. Structure

Figure 14:
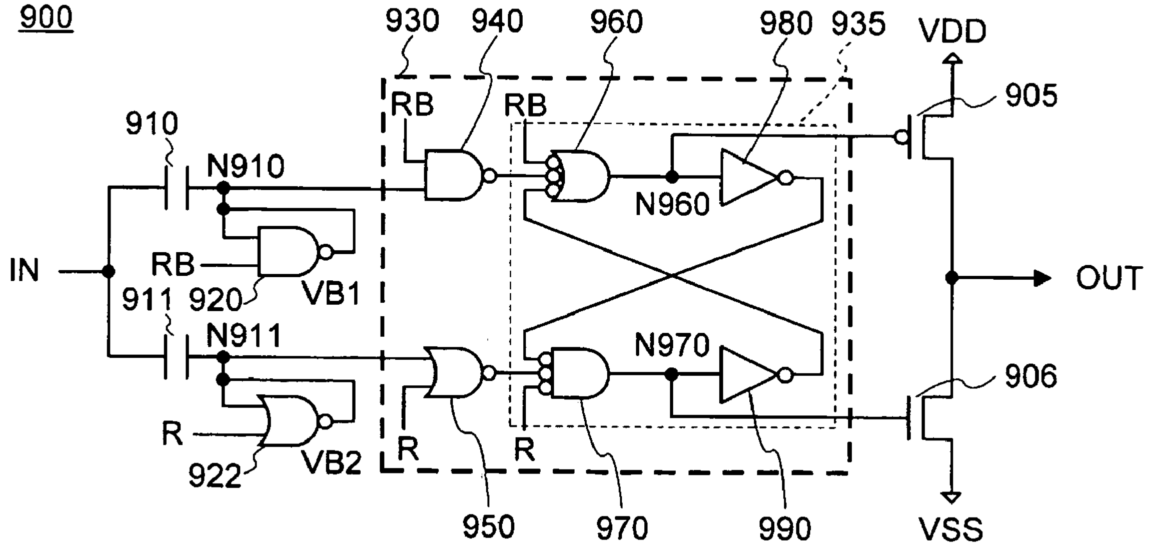
FIG. 14 is a circuit diagram illustrating the structure of a level shift circuit 900 according to a ninth embodiment of the invention.

FIG. 14 is a circuit diagram illustrating the structure of a level shift circuit 900 according to a ninth embodiment of the invention.

The level shift circuit 900 of this embodiment is different from the level shift circuit 800 (see FIG. 13) of the eighth embodiment in that NAND circuits are used as logic inverting circuits 920 and 940 and NOR circuits are used as logic inverting circuits 922 and 950. A reset signal R is input to one input terminal of each of the logic inverting circuits 920 and 940, and an inversion signal RB of the reset signal R is input to one input terminal of each of the logic inverting circuits 922 and 950. These input terminals are different from input terminals connected to capacitors 910 and 911. The other structures are the same as those in the eighth embodiment, and thus a description thereof will be omitted.

9-2. Operation and Effects

Next, the operation of the ninth embodiment will be described. First, when an H-level signal is supplied as the reset signal R and an L-level signal is supplied as the inversion signal RB of the reset signal in order to set the initial state of the level shift circuit 900 to a stationery state, H-level signals are output from the logic inverting circuits 920 and 940, and L-level signals are output from the logic inverting circuits 922 and 950. In this case, transistors constituting complementary transistor circuits included in the respective logic inverting circuits 920, 940, 922, and 950 turn to ON states or OFF states. Therefore, it is possible to prevent both a P-channel transistor and an N-channel transistor constituting the complementary transistor circuit from being operated in a saturation region and to prevent the flow of a drain current.

Next, when an L-level signal is supplied as the reset signal R and an H-level signal is supplied as the inversion signal RB of the reset signal in order to change the initial state or the stationery state of the level shift circuit 900 into an operational state, signals output from the logic inverting circuits 920 and 922 respectively have the bias voltages $V_{B1}$ and $V_{B2}$, which are the logic inversion levels thereof. In addition, the signals output from the logic inverting circuits 940 and 950 respectively have an H-level or an L-level according to the input signal levels with respect to the logic inversion levels thereof.

In this way, at least one of the logic inverting circuits 920, 940, 922, and 950 has an input terminal other than one input terminal connected to the capacitor 910 or the capacitor 911, and an output signal thereof is fixed to a predetermined level, such as an H level or an L level according to the signal input to the other input terminal, regardless of the level of the signal input to the one input terminal. As a result, when the level shift circuit 900 is not operated, it is possible to prevent a drain current from simultaneously flowing through both the P-channel transistor and the N-channel transistor constituting the complementary transistor circuit, and thus to reduce power consumption.

Further, the structure of this embodiment may be applied to the other embodiments. For example, NAND circuits or NOR circuits each of which has the other input terminal may be used as the logic inverting circuits 120, 140, and 150 of the level shift circuit 100 (see FIG. 1) according to the first embodiment.

Further, in this embodiment, the reset signal R input to the logic input unit 935 and the inversion signal RB of the reset signal are input to the other terminal for fixing the output signal. However, the invention is not limited to this structure, but any signal may be input to the other terminal as long as the output signal is fixed. For example, a power save signal and an inversion signal thereof other than the reset signal R and the inversion signal RB of the reset signal may be input.

10. Modifications

The invention is not limited to the above-described embodiments, but changes and modifications of the invention can be made without departing from the spirit and scope of the invention.

For example, the invention is not limited to the respective embodiments, but modifications made by combining characteristics of the above-described embodiments are also included in the invention.

Further, in the above-described embodiments, the P-channel TFT and the N-channel TFT are used as switching elements. However, the invention is not limited thereto, but any switching element may be used as long as it can constitute a complementary transistor. For example, a P-channel MOS transistor or an N-channel MOS transistor may be used as a switching element. Alternatively, a PNP transistor or an NPN transistor may be used as a switching element.

Furthermore, in the above-described embodiments, the logic inverting circuit is mainly used as an inverter circuit. However, the invention is not limited thereto, but any circuit may be used as long as it can invert and output the logic level of an input signal. For example, a NAND circuit, a NOR circuit, and an exclusive-OR circuit may be used as an inverter circuit.

Moreover, in the above-described embodiments, the logic output unit including the logic output circuit is composed of a holding circuit, such as a flip-flop holding the determination result of the first logic inverting circuit and the determination result of the second logic inverting circuit. However, the invention is not limited thereto, but the logic output unit may include circuits other than the holding circuit. For example, the determination result of the first logic inverting circuit and the determination result of the second logic inverting circuit may be input to P-type and N-type switching elements of complementary transistors constituting a current buffer. However, it is preferable to use the holding circuit, from the viewpoint of appropriately following signals having a large gap between adjacent change points.

Further, in the above-described embodiments, the complementary circuit driving signal is output to an integrated output buffer. However, the invention is not limited thereto, but the complementary circuit driving signal may be supplied to an output buffer provided at the outside of a level shift circuit. In this case, the complementary circuit driving signal becomes a logic output signal of the level shift circuit.

11. Structure of Liquid Crystal Panel

Figure 15:
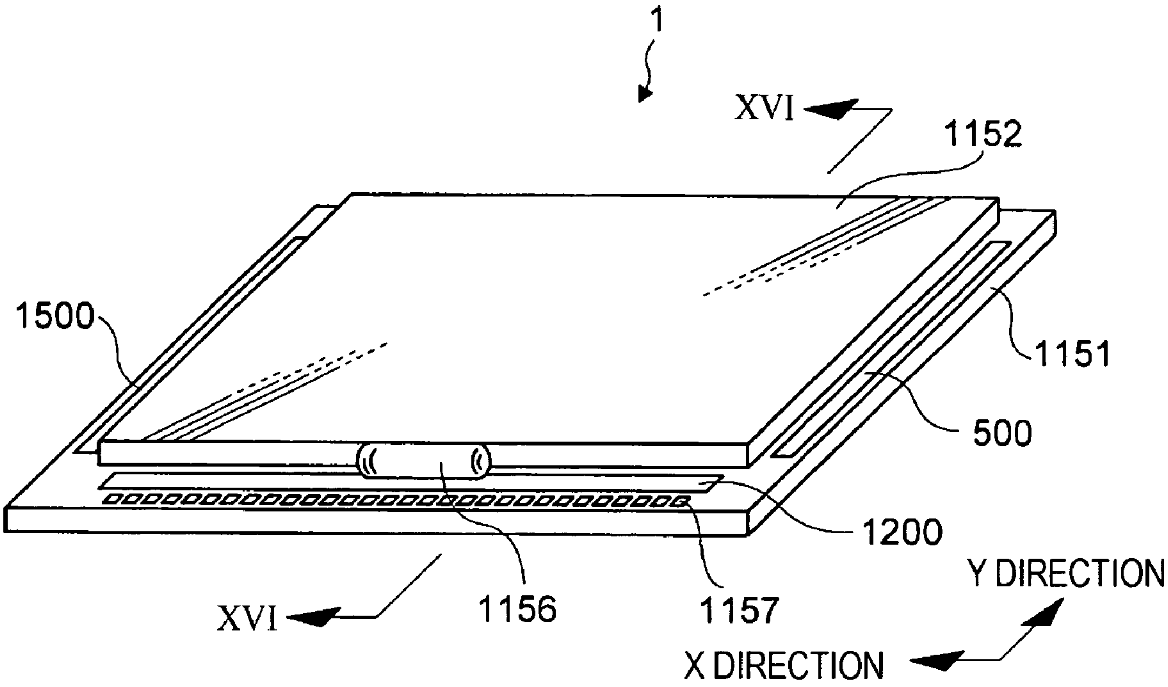
FIG. 15 is a perspective view illustrating the structure of an electro-optical device provided with the level shift circuit.
Figure 16:
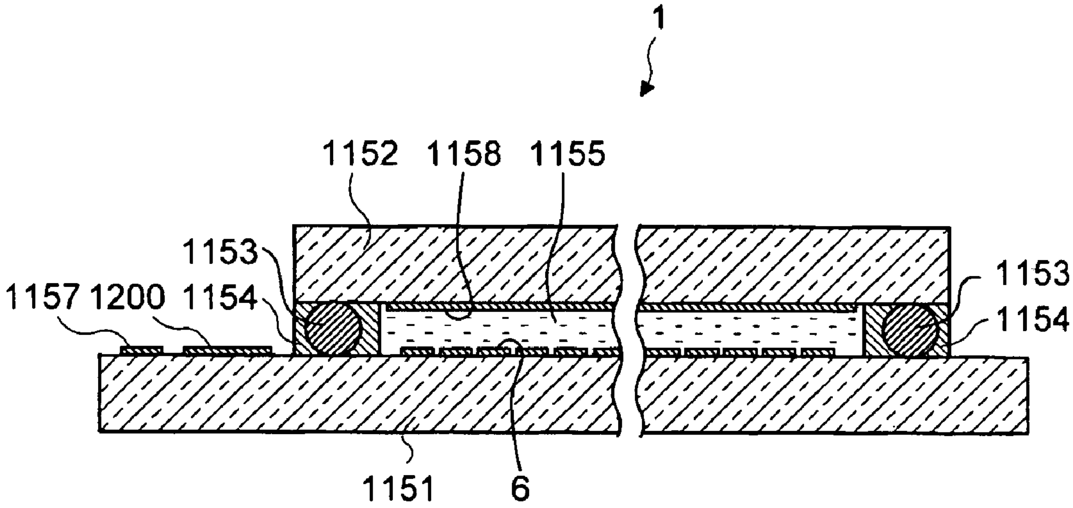
FIG. 16 is a cross-sectional view of the electro-optical device, taken along the line XVI-XVI of FIG. 15.

Next, the overall structure of an electro-optical device 1 having the above-mentioned electrical structure will be described with reference to FIGS. 15 and 16. FIG. 15 is a perspective view illustrating the structure of the electro-optical device 1, and FIG. 16 is a cross-sectional view taken along the line XVI-XVI of FIG. 15. The liquid crystal panel includes an element substrate 1151 which is made of glass or semiconductor and has, for example, pixel electrodes thereon, and a counter substrate 1152 which is made of a transparent material, such as glass, and has, for example, a common electrode 1158 thereon. Liquid crystal 1155 is injected into a space between the element substrate 1151 and the counter substrate 1152.

A sealing member 1154 is provided at a peripheral portion of the counter substrate 1152 to sealing a gap between the element substrate 1151 and the counter substrate 1152. A space into which the liquid crystal 1155 is injected is formed by the sealing member 1154, the element substrate 1151, and the counter substrate 1152. Spacers 1153 are dispersed into the sealing member 1154 to keep a uniform gap between the element substrate 1151 and the counter substrate 1152. In addition, the sealing member 1154 is provided with an opening for injecting the liquid crystal 1155, and the opening is sealed by a sealing material 1156 after the liquid crystal 1155 is injected.

On a surface of the element substrate 1151 opposite to the counter substrate 1152, a data line driving circuit 1200 is formed at the outside of the sealing member 1154 along one side thereof to drive data lines extending in the Y direction. In addition, a plurality of connecting electrodes 1157 are formed along the one side, so that image signals and various signals from a timing generating circuit are input to the connecting electrodes. Further, a scanning line driving circuit 1500 is formed along another side adjacent to the one side to drive scanning lines extending in the X direction. Meanwhile, the common electrode 1158 of the counter substrate 1152 is electrically connected to the element substrate 1151 by a conductive member provided at least one of four corners of a bonding portion between the element substrate 1151 and the counter substrate 1152. In addition, according to the use of the liquid crystal panel, color filters can be provided, for example, in a stripe shape, a mosaic shape, or a triangular shape on the counter substrate 1152. A black matrix, such as resin black obtained by dispersing a metallic material, such as chrome or nickel, or carbon or titanium in a photo resist, can be provided. In addition, a backlight for emitting light to the liquid crystal panel can be provided. Further, in order to perform the modulation of colored light, the color filters are not provided, but the black matrix can be provided on the counter substrate 1152.

Furthermore, for example, alignment films to which a rubbing process has been performed in a predetermined direction are respectively provided on the surfaces of the element substrate 1151 and the counter substrate 1152 opposite to each other, and polarizing plates are provided on the rear surfaces thereof along the alignment direction. However, when polymer-dispersion-type liquid crystal obtained by dispersing minute particles into a polymer is used as the liquid crystal 1155, the above-mentioned alignment films and polarizing plates are not needed. As a result, the usage efficiency of light is improved, which results in an improvement in brightness and a reduction in power consumption. In addition, instead of forming some of or all the peripheral circuits, such as the data line driving circuit 1200 and the scanning line driving circuit 1500, on the element substrate 1151, for example, a driving IC chip mounted on a film by a TAB (tape automated bonding) technique may be electrically and mechanically connected to the element substrate 1151 through an anisotropic conductive film provided at a predetermined position on the element substrate 1151. Further, the driving IC chip may be may be electrically and mechanically connected to the element substrate 1151 through an anisotropic conductive film provided at a predetermined position on the element substrate 1151, by using a COG (chip on glass) technique.

12. Applications

In the above-described embodiments, the electro-optical device having liquid crystal therein is used as an example. However, the invention can be applied to an electro-optical device having an electro-optical material other than the liquid crystal. The electro-optical material means a material whose optical properties, such as transmittance and brightness, are changed by supply of electrical signals (current signals or voltage signals). For example, the invention can be applied to various electro-optical devices, such as a display panel in which OLED elements, such as organic EL (electro-luminescent) elements or light-emitting polymers, are used as an electro-optical material, an electrophoresis display panel in which micro capsules, each containing colored liquid and while particles dispersed into the liquid, are used as an electro-optical material, a twisted ball display panel in which twisted balls each of which regions having different polarities are coated with different colors are used as an electro-optical material, a toner display panel using black toner as an electro-optical material, and a plasma display panel using high-pressure gas, such as helium or neon, as an electro-optical material.

13. Electronic Apparatus

Figure 17:
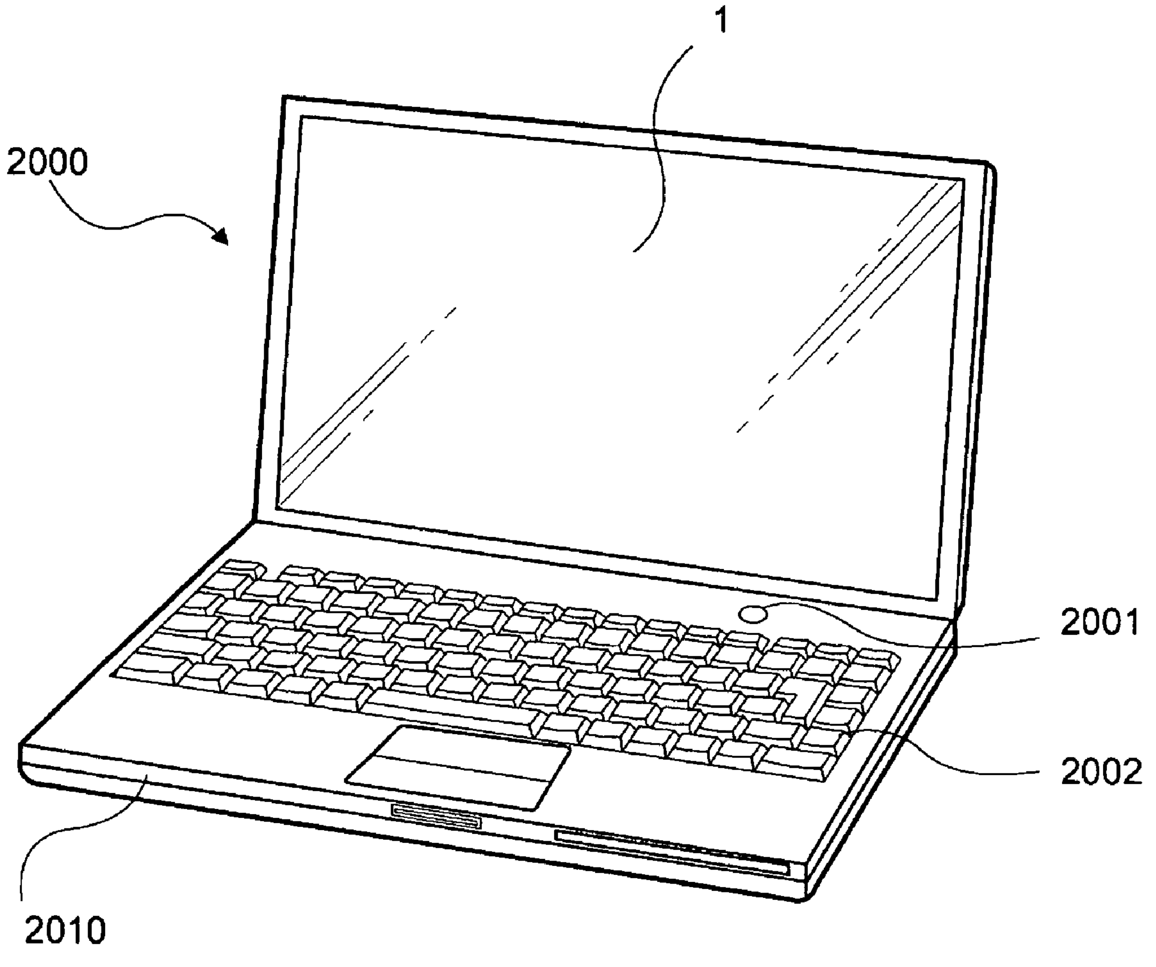
FIG. 17 is a perspective view illustrating the structure of a portable personal computer provided with the electro-optical device.

Next, electronic apparatuses including the electro-optical device 1 according to the above-described embodiment and applications will be described. FIG. 17 shows the structure of a portable personal computer having the electro-optical device 1. A personal computer 2000 includes the electro-optical device 1 serving as a display unit and a main body 2010. The main body 2010 is provided with a power switch 2001 and a keyboard 2002. Since the electro-optical device 1 includes a level shift circuit whose input sensitivity is not affected by a variation in a manufacturing process, the electro-optical device 1 can display a high-quality image.

Figure 18:
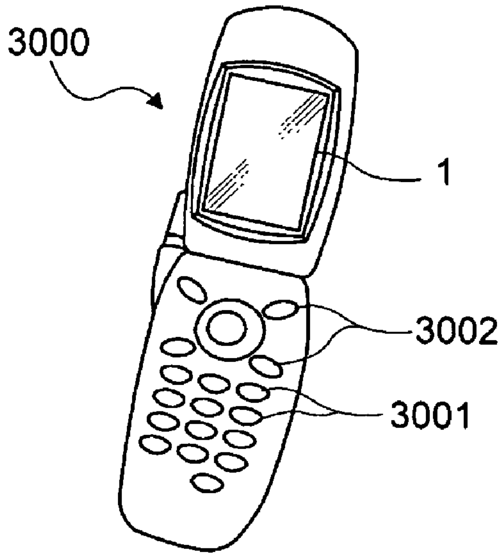
FIG. 18 is a perspective view illustrating the structure of a cellular phone provided with the electro-optical device.
Figure 19:
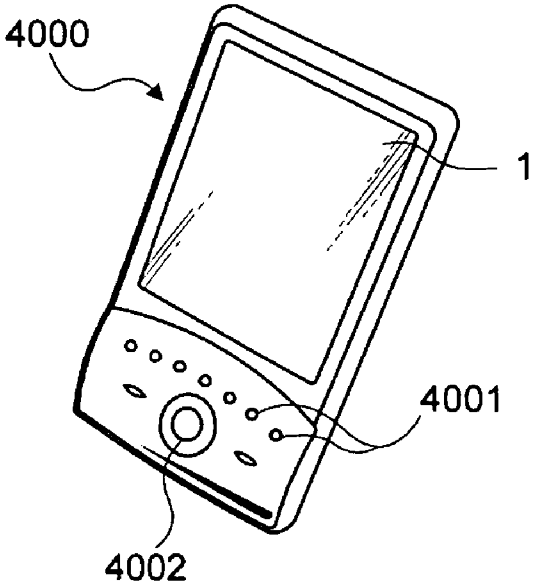
FIG. 19 is a perspective view illustrating the structure of a personal digital assistant provided with the electro-optical device.

FIG. 18 shows the structure of a cellular phone having the electro-optical device 1. A cellular phone 3000 includes a plurality of operating buttons 3001, a scroll button 3002, and the electro-optical device 1 serving as a display unit. The scroll button 3002 is operated to scroll a screen displayed on the electro-optical device 1. FIG. 19 shows the structure of a personal digital assistant (PDA) having the electro-optical device 1. A PDA 4000 includes a plurality of operating buttons 4001, a scroll button 4002, and the electro-optical device 1 serving as a display unit. When the power switch 4002 is operated, various information items, such as an address book and a schedule, are displayed on the electro-optical device 1.

Further, in addition to the electronic apparatuses illustrated in FIGS. 17 to 19, the electronic apparatuses provided with the electro-optical device 1 according to the present invention include a digital still camera, a liquid crystal television set, a viewfinder-type and monitor-direct-view type videotape recorder, a car navigation apparatus, a pager, an electronic organizer, an electronic calculator, a word processor, a work station, a television phone, a POS terminal, and apparatuses equipped with a touch panel. Furthermore, the above-mentioned electro-optical device 1 can be applied to display units of these various electronic apparatuses.

What is claimed is:

1. A level shift circuit comprising:

a capacitor element that has one terminal to which a logic input signal having a first logic amplitude is input;

a logic output circuit that includes a first logic inverting circuit having a first logic inversion level with respect to an input terminal thereof connected to the other terminal of the capacitor element; and a second logic inverting circuit having a second logic inversion level with respect to an input terminal thereof connected to the other terminal of the capacitor element, and that inverts a logic output signal having a second logic amplitude when output polarities of the first logic inverting circuit and the second logic inverting circuit coincide with each other; and a third logic inverting circuit whose input and output terminals are connected to the other terminal of the capacitor element and that has a third logic inversion level with respect to the input terminal thereof connected to the other terminal of the capacitor element, wherein the first logic inversion level is set to be higher than the third logic inversion level, and the second logic inversion level is set to be lower than the third logic inversion level.

2. The level shift circuit according to claim 1, wherein the first logic inverting circuit, the second logic inverting circuit, and the third logic inverting circuit are complementary transistor circuits.

3. The level shift circuit according to claim 1, wherein the first logic inversion level is set on the basis of the ratio of the dimensions of transistor elements constituting the first logic inverting circuit to the dimensions of transistor elements constituting the third logic inverting circuit, or on the basis of the ratio of the number of serial-parallel stages of the transistor elements constituting the first logic inverting circuit to the number of serial-parallel stages of the transistor elements constituting the third logic inverting circuit, and the second logic inversion level is set on the basis of the ratio of the dimensions of the transistor elements constituting the second logic inverting circuit to the dimensions of transistor elements constituting the third logic inverting circuit, or on the basis of the ratio of the number of serial-parallel stages of the transistor elements constituting the second logic inverting circuit to the number of serial-parallel stages of the transistor elements constituting the third logic inverting circuit.

4. The level shift circuit according to claim 1, wherein at least one of the first logic inverting circuit, the second logic inverting circuit, and the third logic inverting circuit has another input terminal, and fixes an output signal to a predetermined level in response to a signal input to another input terminal, regardless of the signal input to the one input terminal.

5. A level shift circuit comprising:

a first capacitor element that has one terminal to which a logic input signal having a first logic amplitude is input;

a second capacitor element that has one terminal to which the logic input signal is input;

a logic output circuit that includes a first logic inverting circuit having a first logic inversion level with respect to an input terminal thereof connected to the other terminal of the first capacitor element; and a second logic inverting circuit having a second logic inversion level with respect to an input terminal thereof connected to the other terminal of the second capacitor element, and that inverts a logic output signal having a second logic amplitude when output polarities of the first logic inverting circuit and the second logic inverting circuit coincide with each other;

a third logic inverting circuit whose input and output terminals are connected to the other terminal of the first capacitor element and that has a third logic inversion level with respect to the input terminal thereof connected to the other terminal of the first capacitor element; and a fourth logic inverting circuit whose input and output terminals are connected to the other terminal of the second capacitor element and that has a fourth logic inversion level with respect to the input terminal thereof connected to the other terminal of the second capacitor element, wherein the first logic inversion level is set to be higher than the third logic inversion level, and the second logic inversion level is set to be lower than the fourth logic inversion level.

6. The level shift circuit according to claim 5, wherein the first logic inverting circuit, the second logic inverting circuit, the third logic inverting circuit, and the fourth logic inverting circuit are complementary transistor circuits.

7. The level shift circuit according to claim 5, wherein the first logic inversion level is set on the basis of the ratio of the dimensions of transistor elements constituting the first logic inverting circuit to the dimensions of transistor elements constituting the third logic inverting circuit, or on the basis of the ratio of the number of serial-parallel stages of the transistor elements constituting the first logic inverting circuit to the number of serial-parallel stages of the transistor elements constituting the third logic inverting circuit, and the second logic inversion level is set on the basis of the ratio of the dimensions of the transistor elements constituting the second logic inverting circuit to the dimensions of transistor elements constituting the fourth logic inverting circuit, or on the basis of the ratio of the number of serial-parallel stages of the transistor elements constituting the second logic inverting circuit to the number of serial-parallel stages of the transistor elements constituting the fourth logic inverting circuit.

8. The level shift circuit according to claim 5, wherein at least one of the first logic inverting circuit, the second logic inverting circuit, the third logic inverting circuit, and the fourth logic inverting circuit has another input terminal, and fixes an output signal to a predetermined level in response to a signal input to another input terminal, regardless of the signal input to the one input terminal.

9. The level shift circuit according to claim 2, wherein the transistor elements are formed by the same manufacturing process.

10. The level shift circuit according to claim 9, wherein the transistor elements are arranged adjacent to each other.

11. The level shift circuit according to claim 9, wherein the shapes of the transistor elements are similar to each other.

12. The level shift circuit according to claim 1, wherein the logic output signal having the second logic amplitude is a complementary circuit driving signal for driving the complementary transistor circuits.

13. The level shift circuit according to claim 12, further comprising:

a complementary transistor circuit that is connected in series to a power source for supplying the second logic amplitude and is driven by the complementary circuit driving signal.

* * * * *